(12) United States Patent
Kim et al.

(10) Patent No.: US 9,640,443 B2
(45) Date of Patent: May 2, 2017

(54) SEMICONDUCTOR DEVICES AND METHODS OF FABRICATING SEMICONDUCTOR DEVICES

(71) Applicant: Samsung Electronics Co., Ltd., Suwon-si, Gyeonggi-do (KR)

(72) Inventors: Kug-Hwan Kim, Uiwang-si (KR); Jong-Ho Lee, Hwaseong-si (KR); Woo-Hee Kim, Suwon-si (KR); Nae-In Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/154,032

(22) Filed: May 13, 2016

(65) Prior Publication Data
US 2016/0276225 A1  Sep. 22, 2016

Related U.S. Application Data

(63) Continuation of application No. 14/489,900, filed on Sep. 18, 2014, now abandoned.

(30) Foreign Application Priority Data

Dec. 27, 2013  (KR) .................. 10-2013-0165541

(51) Int. Cl.
*H01L 21/321* (2006.01)
*H01L 21/8238* (2006.01)
(Continued)

(52) U.S. Cl.
CPC ............. *H01L 21/823842* (2013.01); *H01L 21/823821* (2013.01); *H01L 27/088* (2013.01); (Continued)

(58) Field of Classification Search
CPC ......... H01L 21/02247; H01L 21/02249; H01L 21/28202; H01L 21/3211; H01L 27/088; (Continued)

(56) References Cited

U.S. PATENT DOCUMENTS 8,105,892 B2  1/2012  Kim et al.
8,309,447 B2  11/2012  Cheng et al.
(Continued)

FOREIGN PATENT DOCUMENTS

JP  2005252052 A  * 9/2005
JP  2010-141129     6/2010
(Continued)

*Primary Examiner* — Jarrett Stark
*Assistant Examiner* — Bitew Dinke
(74) *Attorney, Agent, or Firm* — Myers Bigel, P.A.

(57) ABSTRACT

Semiconductor devices are provided. A semiconductor device includes a substrate including first through fourth areas. Moreover, first through fourth gate insulating layers are on the first through fourth areas, respectively. Amounts of work function control materials in the first through fourth gate insulating layers, nitrogen concentrations in the first through fourth gate insulating layers, and/or thicknesses of the first through fourth gate insulating layers vary among the first through fourth gate insulating layers. Methods for fabricating semiconductor devices are also provided.

11 Claims, 24 Drawing Sheets

(51) Int. Cl.
- *H01L 27/088* (2006.01)
- *H01L 29/423* (2006.01)
- *H01L 29/49* (2006.01)
- *H01L 29/51* (2006.01)
- *H01L 27/092* (2006.01)
- *H01L 27/11* (2006.01)
- *H01L 29/66* (2006.01)

(52) U.S. Cl.
CPC ...... *H01L 27/0922* (2013.01); *H01L 27/0924* (2013.01); *H01L 27/1104* (2013.01); *H01L 27/1116* (2013.01); *H01L 29/42364* (2013.01); *H01L 29/4958* (2013.01); *H01L 29/4966* (2013.01); *H01L 29/518* (2013.01); *H01L 29/66545* (2013.01)

(58) Field of Classification Search
CPC ........... H01L 29/42364; H01L 29/4958; H01L 29/518; H01L 21/823821; H01L 29/66545; H01L 27/1116; H01L 27/1104
See application file for complete search history.

(56) References Cited

U.S. PATENT DOCUMENTS

| | | | |
|---|---|---|---|
| 8,513,740 B2 | 8/2013 | Park et al. | |
| 2004/0140518 A1 | 7/2004 | Lee | |
| 2008/0237728 A1* | 10/2008 | Mitsuhashi | H01L 21/28088 257/369 |
| 2008/0258229 A1 | 10/2008 | Ohkawa et al. | |
| 2009/0039433 A1 | 2/2009 | Yang et al. | |
| 2009/0047799 A1* | 2/2009 | Yeh | H01L 21/28185 438/786 |
| 2009/0184376 A1 | 7/2009 | Cho et al. | |
| 2009/0212371 A1 | 8/2009 | Kobayashi | |
| 2010/0052066 A1 | 3/2010 | Yu et al. | |
| 2010/0124805 A1 | 5/2010 | Na et al. | |
| 2010/0127336 A1 | 5/2010 | Chambers et al. | |
| 2010/0164007 A1* | 7/2010 | Onishi | G11C 11/412 257/369 |
| 2010/0276753 A1 | 11/2010 | Greene et al. | |
| 2010/0330812 A1 | 12/2010 | Akiyama et al. | |
| 2011/0198699 A1 | 8/2011 | Hung et al. | |
| 2011/0256682 A1 | 10/2011 | Yu et al. | |
| 2011/0284971 A1 | 11/2011 | Sakashita et al. | |
| 2012/0129327 A1 | 5/2012 | Lee | |
| 2012/0139055 A1 | 6/2012 | Sato et al. | |
| 2012/0211837 A1 | 8/2012 | Baars et al. | |
| 2012/0223391 A1 | 9/2012 | Fujita et al. | |
| 2013/0049134 A1 | 2/2013 | Sunamura | |
| 2013/0082332 A1 | 4/2013 | Liu et al. | |
| 2013/0154021 A1 | 6/2013 | Chuang et al. | |
| 2013/0161753 A1* | 6/2013 | Yoshimori | H01L 27/088 257/368 |
| 2014/0001474 A1 | 1/2014 | Hong | |
| 2014/0061809 A1* | 3/2014 | Yu | H01L 27/1104 257/368 |
| 2014/0061813 A1* | 3/2014 | Yu | H01L 27/1104 257/369 |
| 2014/0061814 A1* | 3/2014 | Kim | H01L 21/823857 257/369 |
| 2014/0070327 A1 | 3/2014 | Niimi et al. | |
| 2014/0113443 A1* | 4/2014 | Won | H01L 21/28185 438/591 |
| 2014/0159211 A1* | 6/2014 | Lin | H01L 21/02164 257/632 |
| 2014/0252487 A1 | 9/2014 | Stephens et al. | |
| 2014/0363960 A1 | 12/2014 | Kim et al. | |
| 2015/0069533 A1* | 3/2015 | Lin | H01L 21/28088 257/410 |
| 2015/0243658 A1* | 8/2015 | Joshi | H01L 27/0886 257/392 |

FOREIGN PATENT DOCUMENTS

| | | |
|---|---|---|
| JP | 2012-033694 | 2/2012 |
| JP | 2012-186259 | 9/2012 |
| JP | 2013-118311 | 6/2013 |

* cited by examiner

| F | SMC1 | SMC2 | F | MR | |
|---|------|------|---|----|---|
|   | ..... | ..... |   | ..... | |

1200

1300

1400

SEMICONDUCTOR DEVICES AND METHODS OF FABRICATING SEMICONDUCTOR DEVICES

CROSS-REFERENCE TO RELATED APPLICATION

The present application is a continuation application of and claims priority from U.S. patent application Ser. No. 14/489,900, filed on Sep. 18, 2014, which claims priority from Korean Patent Application No. 10-2013-0165541, filed on Dec. 27, 2013 in the Korean Intellectual Property Office, the disclosures of which are hereby incorporated herein by reference in their entirety.

BACKGROUND

The present disclosure relates to semiconductor devices. A semiconductor device may include transistors having different threshold voltages, respectively. Examples of transistors having different threshold voltages may include a combination of a logic transistor, a static random access memory (SRAM) transistor, or a dynamic random access memory (DRAM) transistor, among others. Moreover, various methods of controlling threshold voltages of transistors included in a semiconductor device have been researched.

SUMMARY

Various embodiments of present inventive concepts may provide a semiconductor device in which threshold voltages of a plurality of transistors can be controlled relatively easily. Moreover, various embodiments of present inventive concepts may provide a method of fabricating a semiconductor device, where the method may be employed to relatively easily fabricate a plurality of transistors having different respective threshold voltages at relatively low costs. Aspects of present inventive concepts, however, are not restricted to a particular embodiment set forth herein. The above and other aspects of present inventive concepts will become more apparent to one of ordinary skill in the art to which the present inventive concepts pertain by referencing the detailed description of present inventive concepts given below.

Various embodiments of present inventive concepts provide a semiconductor device. The semiconductor device may include a substrate including first through fourth areas. The semiconductor device may include first through fourth gate insulating layers on the first through fourth areas of the substrate, respectively. The semiconductor device may include first through fourth work function layers on the first through fourth gate insulating layers, respectively. Moreover, the semiconductor device may include first through fourth gate metals on the first through fourth work function layers, respectively. First and second nitrogen concentrations of the first and second gate insulating layers, respectively, may be higher than third and fourth nitrogen concentrations of the third and fourth gate insulating layers, respectively. Additionally, first and second thicknesses of the first and third gate insulating layers, respectively, may be thicker than third and fourth thicknesses of the second and fourth gate insulating layers, respectively.

In various embodiments, the third and fourth nitrogen concentrations may be zero. In some embodiments, the first and second nitrogen concentrations may be equal nitrogen concentrations. Moreover, the first through fourth gate insulating layers may each include an interface layer and a high-k layer. In other words, the first through fourth gate insulating layers may include first through fourth interface layers, respectively, as well as first through fourth high-k layers, respectively.

According to various embodiments, the first and second thicknesses may be equal (e.g., equally thick as each other), and the third and fourth thicknesses may be equal (e.g., equally thick as each other). In some embodiments, the first through fourth gate insulating layers may include first through fourth amounts (e.g., quantities and/or concentrations), respectively, of a work function control material, and the first and second amounts may be unequal to the third and fourth amounts. Moreover, the work function control material may include lanthanum. Alternatively, the work function control material may include aluminum.

In various embodiments, the first through fourth gate insulating layers, the first through fourth work function layers, and the first through fourth gate metals may be included in first through fourth transistors, respectively. Moreover, the first through fourth transistors may have different first through fourth threshold voltages, respectively. In some embodiments, the second threshold voltage may be higher than the third threshold voltage. In some embodiments, the fourth threshold voltage may be higher than the first threshold voltage.

According to various embodiments, the substrate may include fifth through eighth areas. Moreover, the semiconductor device may further include fifth through eighth gate insulating layers on the fifth through eighth areas, respectively. The semiconductor device may also include fifth through eighth work function layers on the fifth through eighth gate insulating layers, respectively. Additionally, the semiconductor device may include fifth through eighth gate metals on the fifth through eighth work function layers, respectively. In some embodiments, fifth and sixth nitrogen concentrations of the fifth and sixth gate insulating layers, respectively, may be higher than seventh and eighth nitrogen concentrations of the seventh and eighth gate insulating layers, respectively. Moreover, fifth and sixth thicknesses of the fifth and seventh gate insulating layers, respectively, may be thicker than seventh and eight thicknesses of the sixth and eighth gate insulating layers, respectively.

In various embodiments, the first through eighth gate insulating layers, the first through eighth work function layers, and the first through eighth gate metals may be included in first through eighth transistors, respectively. The first through eighth transistors may have first through eighth threshold voltages, respectively. The first threshold voltage may be higher than the fourth threshold voltage, and the fifth threshold voltage may be lower than the eighth threshold voltage. Alternatively, the first threshold voltage may be higher than the fourth threshold voltage, and the fifth threshold voltage may be higher than the eighth threshold voltage.

A method of fabricating a semiconductor device, according to various embodiments, may be provided. The method may include forming a gate insulating layer on first through fourth areas of a substrate. The method may include providing a first concentration of nitrogen to portions of the gate insulating layer that are formed on the first and second areas of the substrate, and a second concentration of nitrogen to portions of the gate insulating layer that are formed on the third and fourth areas of the substrate. The second concentration of nitrogen may be a different concentration from the first concentration of nitrogen. The method may include forming a work function control material providing layer on the first through fourth areas of the substrate. The method may include forming a capping layer on the work function control material providing layer. The capping layer may be formed to a first thickness on the first and third areas of the substrate, and to a second thickness, which is different from the first thickness, on the second and fourth areas of the substrate. Moreover, the method may include annealing the substrate.

In various embodiments, providing the first and second concentrations of nitrogen to the gate insulating layer may include forming a mask on the third and fourth areas of the substrate, and then nitriding the portions of the gate insulating layer formed on the first through fourth areas.

According to various embodiments, forming the capping layer may include forming first and second capping layers that are stacked sequentially. The first capping layer may include the different first and second thicknesses. Moreover, the second capping layer may be formed to a third thickness on the first and third areas of the substrate that is equally thick as a fourth thickness of the second capping layer on the second and fourth areas of the substrate. In some embodiments, the first and second capping layers may include a nitride layer and a semiconductor material, respectively. In some embodiments, the first and second capping layers (e.g., the nitride layer and the semiconductor material) may include titanium nitride (TiN) and silicon (Si), respectively.

In various embodiments, forming the capping layer may include forming first and second capping layers that are stacked sequentially. A third thickness of portions of the first capping layer formed on the first and third areas of the substrate may be equally thick as a fourth thickness of portions of the first capping layer formed on the second and fourth areas of the substrate. Moreover, the method may include removing the second capping layer from the first and third areas of the substrate but not the second and fourth areas of the substrate.

According to various embodiments, the work function control material providing layer may include a work function control material. The work function control material may include any one of lanthanum and aluminum. In some embodiments, forming the gate insulating layer may include forming first through fourth gate insulating layers on the first through fourth areas of the substrate, respectively. Moreover, after annealing the substrate, a first amount of the work function control material in each of the first and second gate insulating layers may be different from a second amount of the work function control material in each of the third and fourth gate insulating layers. Also, third and fourth thicknesses of the first and third gate insulating layers, respectively, may be different from fifth and sixth thicknesses of the second and fourth gate insulating layers, respectively.

In various embodiments, forming the gate insulating layer on the first through fourth areas may include forming an interlayer insulating film including first through fourth trenches formed on the first through fourth areas, respectively. Moreover, forming the gate insulating layer may include forming the gate insulating layer in the first through fourth trenches.

A semiconductor device, according to various embodiments, may include a substrate including first through fourth areas. The semiconductor device may include first through fourth gate insulating layers on the first through fourth areas, respectively. The semiconductor device may include first through fourth work function layers on the first through fourth gate insulating layers, respectively. Moreover, the semiconductor device may include first through fourth gate metals on the first through fourth work function layers, respectively. The first and second gate insulating layers, but not the third and fourth gate insulating layers, may include nitrogen. Also, the first and third gate insulating materials include different first and second amounts of a work function control material, respectively.

A method of fabricating a semiconductor device, according to various embodiments, may include forming a gate insulating layer on first through fourth areas of a substrate. The method may include providing a first concentration of nitrogen to portions of the gate insulating layer that are formed on the first and second areas of the substrate, and a second concentration of nitrogen to portions of the gate insulating layer that are formed on the third and fourth areas of the substrate. The second concentration of nitrogen may include a different concentration from the first concentration of nitrogen. The method may include forming a blocking layer on the gate insulating layer. The method may include removing the blocking layer from the second and fourth areas of the substrate, but not the first and third areas of the substrate. The method may include forming a work function control material providing layer on the first through fourth areas of the substrate. The method may include forming a capping layer on the work function control material providing layer. Moreover, the method may include annealing the substrate.

A semiconductor device, according to various embodiments herein, may include a substrate including first through fourth areas thereof. The second area of the substrate may be between the first and third areas of the substrate, and the third area of the substrate may be between the second and fourth areas of the substrate. Moreover, the semiconductor device may include first through fourth transistors on the first through fourth areas of the substrate, respectively. The first through fourth transistors may include first through fourth gate insulating layers, respectively. Moreover, the first gate insulating layer may include a first amount of a work function control material that is different from a second amount of the work function control material that is in one of the second through fourth gate insulating layers.

In various embodiments, the first gate insulating layer may include a first thickness that is different from a second thickness of one of the second through fourth gate insulating layers. In some embodiments, each of the first through fourth transistors may include a work function layer on the respective one of the first through fourth gate insulating layers. Moreover, each of the first through fourth transistors may include a gate metal on the work function layer. The first thickness may be a thickness of a portion of the first gate insulating layer that extends along a sidewall of the work function layer of the first transistor.

According to various embodiments, the first gate insulating layer may include a first nitrogen concentration that is different from a second nitrogen concentration of one of the second through fourth gate insulating layers. In some embodiments, the first and third gate insulating layers may include a first thickness that is thicker than a second thickness of the second and fourth gate insulating layers. The first and second gate insulating layers may include a first nitrogen concentration that is higher than a second nitrogen concentration of the third and fourth gate insulating layers. The first amount of the work function control material may be smaller than the second amount of the work function control material. The third and fourth gate insulating layers may include the second amount of the work function control material. Moreover, the first and second gate insulating layers may include the first amount of the work function control material that is smaller than the second amount of the work function control material of the third and fourth gate insulating layers.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 15:
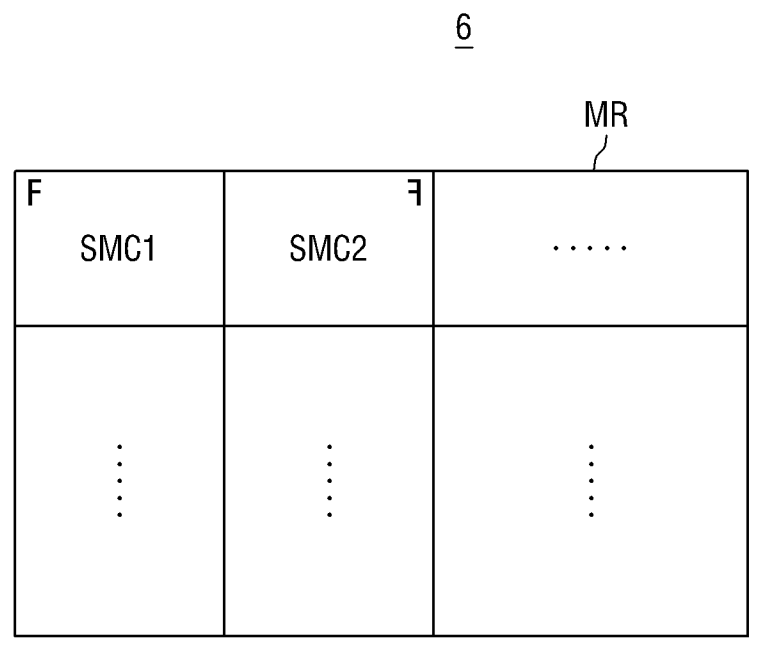

FIG. 15 is a conceptual diagram of a semiconductor device according to various embodiments of present inventive concepts.

DETAILED DESCRIPTION

Figure 1:
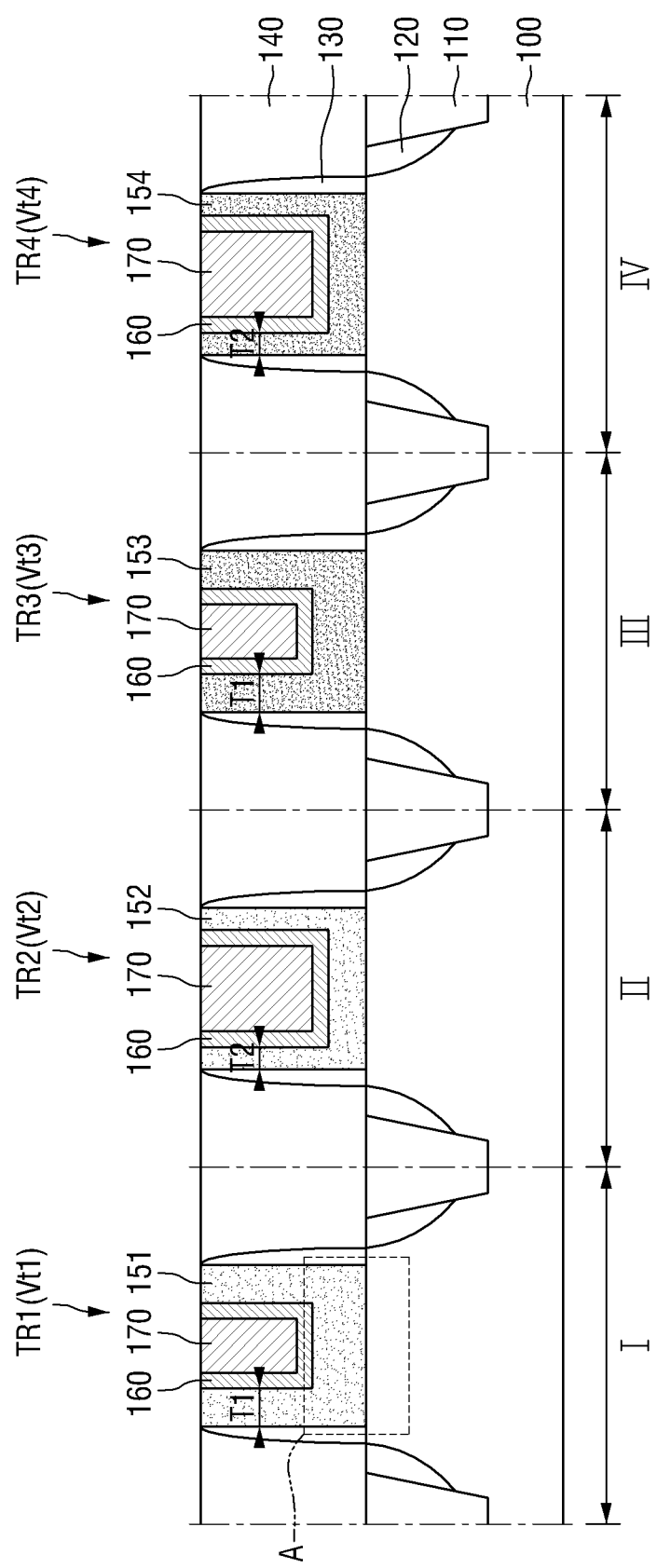
FIG. 1 is a cross-sectional view of a semiconductor device according to various embodiments of present inventive concepts.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout the description.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

Example embodiments of present inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of present inventive concepts should not be construed as limited to the particular shapes of regions illustrated herein but are to include deviations in shapes that result, for example, from manufacturing. Accordingly, the regions illustrated in the figures are schematic in nature and their shapes may not illustrate the actual shape of a region of a device and are not intended to limit the scope of example embodiments.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Figure 2:
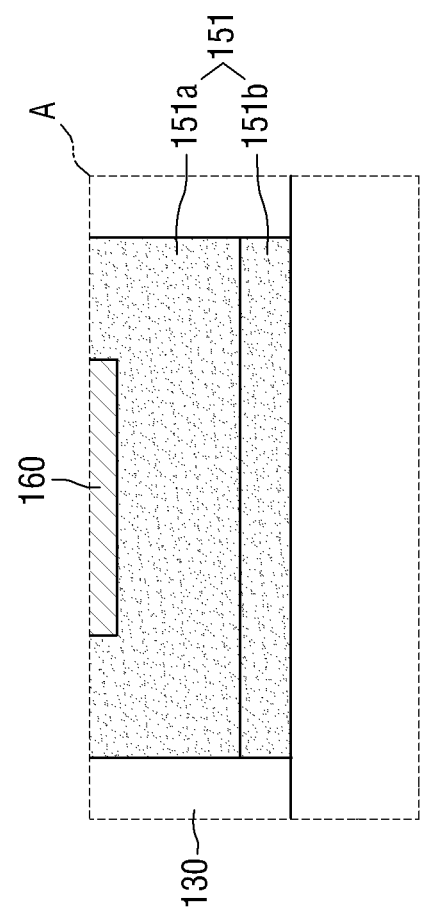
FIG. 2 is an enlarged view of a region A of FIG. 1.

FIG. 1 is a cross-sectional view of a semiconductor device 1 according to various embodiments of present inventive concepts. FIG. 2 is an enlarged view of a region A of FIG. 1.

Referring to FIG. 1, a substrate 100 of the semiconductor device 1 may include first through fourth areas I through IV. The substrate 100 may be, for example, a bulk silicon substrate or a silicon-on-insulator (SOI) substrate. Otherwise, the substrate 100 may be a silicon substrate or may be a substrate made of another material such as silicon germanium, indium antimonide, lead telluride, indium arsenide, indium phosphide, gallium arsenide, or gallium antimonide.

Alternatively, the substrate 100 may consist of a base substrate and an epitaxial layer formed on the base substrate. If active fins are to be formed using the epitaxial layer formed on the base substrate, the epitaxial layer may include silicon or germanium that is a single-element semiconductor material. Moreover, the epitaxial layer may include a compound semiconductor such as a group IV-IV compound semiconductor or a group III-V compound semiconductor. Specifically, the group IV-IV compound semiconductor that can be used to form the epitaxial layer may be a binary or ternary compound containing two or more of carbon (C), silicon (Si), germanium (Ge), and tin (Sn), or a compound obtained by doping the binary or ternary compound with a group IV element. The group III-V compound semiconductor that can be used to form the epitaxial layer may be one of a binary compound, a ternary compound, and a quaternary compound formed by combining at least one of aluminum (Al), gallium (Ga), and indium (In), which are group III elements, with one of phosphorous (P), arsenic (As), and antimony (Sb), which are group V elements.

In some embodiments, first through fourth transistors TR1 through TR4 may be formed in the first through fourth areas I through IV of the substrate 100, respectively. The first through fourth transistors TR1 through TR4 may be separated from each other by element isolation layers 110 formed in the substrate 100. The element isolation layers 110 may be, e.g., shallow trench isolation (STI) layers.

If the substrate 100 includes active fins formed by patterning the epitaxial layer on the base substrate as described above, the element isolation layers 110 may be deep trench isolation (DTI) layers. Accordingly, the element isolation layers 110 according to various embodiments of present inventive concepts are not limited to the illustration of FIG. 1.

The first through fourth transistors TR1 through TR4 may respectively include source-drain regions 120, first through fourth gate insulating layers 151 through 154, n-type work function layers 160, gate metals 170, and spacers 130.

Specifically, the first transistor TR1 formed in the first area I of the substrate 100 may include the source-drain regions 120, the first gate insulating layer 151, the n-type work function layer 160, the gate metal 170, and the spacers 130. The second transistor TR2 formed in the second area II of the substrate 100 may include the source-drain regions 120, the second gate insulating layer 152, the n-type work function layer 160, the gate metal 170, and the spacers 130. The third transistor TR3 formed in the third area III of the substrate 100 may include the source-drain regions 120, the third gate insulating layer 153, the n-type work function layer 160, the gate metal 170, and the spacers 130. The fourth transistor TR4 formed in the fourth area IV of the substrate 100 may include the source-drain regions 120, the fourth gate insulating layer 154, the n-type work function layer 160, the gate metal 170, and the spacers 130.

The source-drain regions 120 may be formed by injecting predetermined impurities into the substrate 100. If, for example, the first through fourth transistors TR1 through TR4 according to some embodiments are n-type metal oxide semiconductor (NMOS) transistors, then n-type impurities may be injected into the source-drain regions 120.

In some embodiments, the source-drain regions 120 may also be elevated source-drain regions. In this case, the source-drain regions 120 may be formed in the form of epitaxial layers within trenches formed in the substrate 100. Accordingly, the shape of the source-drain regions 120 is not limited to the shape illustrated in FIG. 1.

An interlayer insulating film 140 may include a plurality of trenches formed on/in the first through fourth areas I through IV, respectively. The spacers 130 may be disposed on opposing sides of each of the trenches. Each of the spacers 130 may include at least one of a nitride layer and an oxynitride layer. Moreover, in some embodiments, each of the spacers 130 may be shaped like an 'L' or an 'I', unlike the shape illustrated in FIG. 1. The first gate insulating layer 151, the n-type work function layer 160, and the gate metal 170 may be sequentially formed in the trench formed on/in the first area I of the substrate 100.

Referring to FIG. 2, in some embodiments of present inventive concepts, the first gate insulating layer 151 may include an interface layer 151b and a high-k layer 151a. The interface layer 151b may improve/compensate for the poor interface between the substrate 100 and the high-k layer 151a. The interface layer 151b may include a low-k material layer having a dielectric constant (k) of 9 or less such as a silicon oxide layer (having a dielectric constant k of approximately 4) or a silicon oxynitride layer (having a dielectric constant k of approximately 4 to 8 according to contents of oxygen and nitrogen atoms). Alternatively, the interface layer 151b may be made of silicate or a combination of the above example layers.

The high-k layer 151a may be made of a high-k material. In some embodiments of present inventive concepts, the high-k layer 151a may be made of, but is not limited to, Hafnium Oxide ($HfO_2$), Aluminum Oxide ($Al_2O_3$), Zirconium Dioxide ($ZrO_2$), or Tantalum Dioxide ($TaO_2$).

Referring back to FIG. 1, the first gate insulating layer 151 may extend in a first direction (e.g., a vertical direction in FIG. 1) along sidewalls of the spacers 130. In some embodiments (e.g., referring to FIGS. 1 and 2), the first gate insulating layer 151 is shaped as described above because it is formed by a replacement process (or a gate last process).

Various embodiments of present inventive concepts, however, are not limited thereto, and the shape of the first gate insulating layer 151 can vary as desired. That is, unlike in FIG. 1, in some embodiments of present inventive concepts, the first gate insulating layer 151 may be formed by a gate first process. In this case, the first gate insulating layer 151 may not extend upward along the sidewalls of the spacers 130.

In some embodiments (e.g., referring to FIGS. 1 and 2), if the first transistor TR1 is an NMOS transistor, the n-type work function layer 160 formed on the first gate insulating layer 151 may be, but is not limited to, Titanium Aluminide (TiAl), Titanium Aluminum Nitride (TiAlN), Tantalum Carbide (TaC), Tantalum Aluminum Nitride (TaAlN), Titanium Carbide (TiC), or Hafnium Silicide (HfSi).

The gate metal 170 may fill a trench formed by the n-type work function layer 160. In some embodiments of present inventive concepts, the gate metal 170 may include a metal having high conductivity. Examples of the metal may include, but are not limited to, aluminum (Al) and tungsten (W).

In addition to forming the first gate insulating layer 151 as described above, the second through fourth gate insulating layers 152 through 154 may respectively be formed in the trenches formed on the second through fourth areas II through IV of the substrate 100. Like the first gate insulating layer 151, each of the second through fourth gate insulating layers 152 through 154 may include an interface layer and a high-k layer.

The second gate insulating layer 152 formed on the second area II of the substrate 100 may be thinner than the first gate insulating layer 151. That is, when the first gate insulating layer 151 has a first thickness T1, the second gate insulating layer 152 may have a second thickness T2 smaller than the first thickness T1.

In some embodiments (e.g., referring to FIGS. 1 and 2), the first gate insulating layer 151 and the second gate insulating layer 152 may be nitrided layers. In some embodiments, nitrogen concentrations of the first gate insulating layer 151 and the second gate insulating layer 152 may be greater than those of the third gate insulating layer 153 and the fourth gate insulating layer 154. In some embodiments of present inventive concepts, the nitrogen concentration of the first gate insulating layer 151 may be equal to the nitrogen concentration of the second gate insulating layer 152.

The third gate insulating layer 153 formed on the third area III of the substrate 100 may be thicker than the second gate insulating layer 152 and the fourth gate insulating layer 154. In particular, when the second gate insulating layer 152 and the fourth gate insulating layer 154 have the second thickness T2, the third gate insulating layer 153 may have the first thickness T1 greater than the second thickness T2. In some embodiments of present inventive concepts, the thickness of the third gate insulating layer 153 may be equal to the thickness of the first gate insulating layer 151.

The fourth gate insulating layer 154 formed on the fourth area IV of the substrate 100 may be thinner than the first gate insulating layer 151 and the third gate insulating layer 153. In particular, when the first gate insulating layer 151 and the third gate insulating layer 153 have the first thickness T1, the fourth gate insulating layer 154 may have the second thickness T2 smaller than the first thickness T1. In some embodiments of present inventive concepts, the thickness of the fourth gate insulating layer 154 may be equal to the thickness of the second gate insulating layer 152.

In some embodiments of present inventive concepts, the third gate insulating layer 153 and the fourth gate insulating layer 154 may be unnitrided layers. In other words, the third gate insulating layer 153 and the fourth gate insulating layer 154 may not contain nitrogen.

If the first gate insulating layer 151 and the second gate insulating layer 152 are nitrided layers, whereas the third gate insulating layer 153 and the fourth gate insulating layer 154 are unnitrided layers, the amount of a work function control material contained in each of the first gate insulating layer 151 and the second gate insulating layer 152 may be different from that of the work function control material contained in each of the third gate insulating layer 153 and the fourth gate insulating layer 154. Specifically, the amount of the work function control material contained in each of the first gate insulating layer 151 and the second gate insulating layer 152 may be smaller than that of the work function control material contained in each of the third gate insulating layer 153 and the fourth gate insulating layer 154. This will be described in detail later with reference to FIG. 9.

In some embodiments (e.g., referring to FIGS. 1 and 2), because the first through fourth gate insulating layers 151 through 154 contain different amounts of the work function control material and have different thicknesses, the first through fourth transistors TR1 through TR4 may have different threshold voltages Vt1 through Vt4.

Table 1 below compares the threshold voltages Vt1 through Vt4 of the first through fourth transistors TR1 through TR4 in a case where the first through fourth transistors TR1 through TR4 are NMOS transistors and where the first and second gate insulating layers 151 and 152 have been nitrided (as indicated by the characters "N1"), whereas the third and fourth gate insulating layers 153 and 154 have not been nitrided.

TABLE 1

| | TR1 | TR2 | TR3 | TR4 |
|---|---|---|---|---|
| Thickness of gate insulating layer | T1(>T2) | T2 | T1(>T2) | T2 |
| Nitrogen concentration of gate insulating layer | N1 | N1 | 0 | 0 |
| Amount of lanthanum (La) contained in gate insulating layer | M1(<M2) | M1(<M2) | M2 | M2 |
| Threshold voltage | Vt1(>Vt2) | Vt2(>Vt3) | Vt3(>Vt4) | Vt4 |

Referring to Table 1 and FIG. 1, because the first gate insulating layer 151 and the third gate insulating layer 153 are thicker than the second gate insulating layer 152 and the fourth gate insulating layer 154, the threshold voltage Vt1 of the first transistor TR1 and the threshold voltage Vt3 of the third transistor TR3 may be higher than the threshold voltage Vt2 of the second transistor TR2 and the threshold voltage Vt4 of the fourth transistor TR4, respectively.

Figure 9:
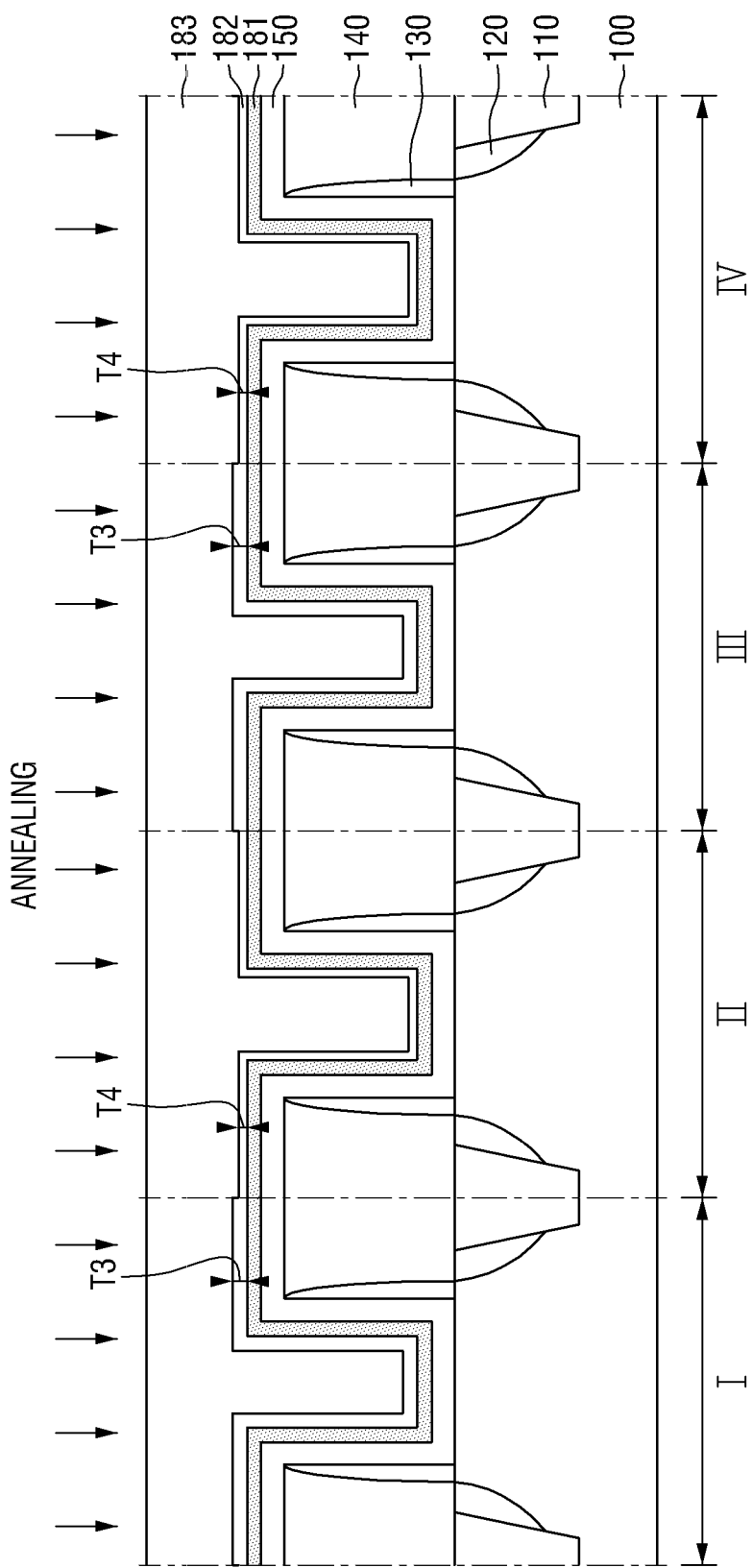

In addition, because the first gate insulating layer 151 and the second gate insulating layer 152 have been nitrided, whereas the third gate insulating layer 153 and the fourth gate insulating layer 154 have not been nitrided, as described above herein, nitrogen contained in the first gate insulating layer 151 and the second gate insulating layer 152 may block the diffusion of lanthanum (La) into the first gate insulating layer 151 and the second gate insulating layer 152 in a fabrication process that will be described herein with reference to FIG. 9, etc. Therefore, the amount of lanthanum diffused to the third gate insulating layer 153 and the fourth gate insulating layer 154 may be greater than that of lanthanum diffused to the first gate insulating layer 151 and the second gate insulating layer 152.

Accordingly, the threshold voltage Vt1 of the first transistor TR1 and the threshold voltage Vt2 of the second transistor TR2 may be higher than the threshold voltage Vt3 of the third transistor TR3 and the threshold voltage Vt4 of the fourth transistor TR4.

In summary, the first transistor TR1 including the first gate insulating layer 151, which has the first thickness T1 and contains a small amount (as indicated by the characters "M1") of lanthanum, has the highest threshold voltage Vt1, and the fourth transistor TR4 including the fourth gate insulating layer 154, which has the second thickness T2 and contains a large amount (as indicated by the characters "M2") of lanthanum, has the lowest threshold voltage Vt4. In addition, the threshold voltage Vt2 of the second transistor TR2 including the second gate insulating layer 152, which has the relatively small second thickness T2 but contains a small amount (M1) of lanthanum, is higher than the threshold voltage Vt3 of the third transistor TR3 including the third gate insulating layer 153, which has the relatively great first thickness T1 but contains a large amount (M2) of lanthanum.

In other words, the first through fourth transistors TR1 through TR4 included in the semiconductor device 1 can be relatively easily controlled to have different threshold voltages.

In some embodiments of present inventive concepts, the third gate insulating layer 153 and the fourth gate insulating layer 154 may also be nitrided layers. However, the nitrogen concentrations of the third gate insulating layer 153 and the fourth gate insulating layer 154 may be lower than those of the first gate insulating layer 151 and the second gate insulating layer 152. In some embodiments, the nitrogen concentration of the third gate insulating layer 153 may be equal to the nitrogen concentration of the fourth gate insulating layer 154.

Table 2 below compares the threshold voltages Vt1 through Vt4 of the first through fourth transistors TR1 through TR4 in a case where the first through fourth transistors TR1 through TR4 are NMOS transistors, where lanthanum is used as the work function control material, where all of the first through fourth gate insulating layers 151 through 154 have been nitrided, and where the nitrogen concentrations (N1) of the third and fourth gate insulating layers 153 and 154 are lower than the nitrogen concentrations (N2) of the first and second gate insulating layers 151 and 152.

TABLE 2

|  | TR1 | TR2 | TR3 | TR4 |
|---|---|---|---|---|
| Thickness of gate insulating layer | T1(>T2) | T2 | T1(>T2) | T2 |
| Nitrogen concentration of gate insulating layer | N2(>N1) | N2(>N1) | N1 | N1 |
| Amount of La contained in gate insulating layer | M1(<M2) | M1(<M2) | M2 | M2 |
| Threshold voltage | Vt1(>Vt2) | Vt2(>Vt3) | Vt3(>Vt4) | Vt4 |

A high concentration of nitrogen in the first gate insulating layer 151 and the second gate insulating layer 152 can better block the diffusion of lanthanum into the first gate insulating layer 151 and the second gate insulating layer 152 in the fabrication process which will be described herein with reference to FIG. 9, etc. Therefore, as described herein (e.g., as described above), the amount of lanthanum diffused to the third gate insulating layer 153 and the fourth gate insulating layer 154 may be greater than the amount of lanthanum diffused to the first gate insulating layer 151 and the second gate insulating layer 152.

Accordingly, the threshold voltage Vt1 of the first transistor TR1 and the threshold voltage Vt2 of the second transistor TR2 may be higher than the threshold voltage Vt3 of the third transistor TR3 and the threshold voltage Vt4 of the fourth transistor TR4. Thus, in Table 2, the first transistor TR1 including the first gate insulating layer 151, which has the first thickness T1 and contains a small amount (M1) of lanthanum, has the highest threshold voltage Vt1, and the fourth transistor TR4 including the fourth gate insulating layer 154, which has the second thickness T2 and contains a large amount (M2) of lanthanum, has the lowest threshold voltage Vt4. In addition, the threshold voltage Vt2 of the second transistor TR2 including the second gate insulating layer 152, which has the relatively small second thickness T2 but contains a small amount (M1) of lanthanum, is higher than the threshold voltage Vt3 of the third transistor TR3 including the third gate insulating layer 153, which has the relatively great first thickness T1 but contains a large amount (M2) of lanthanum.

Figure 3:
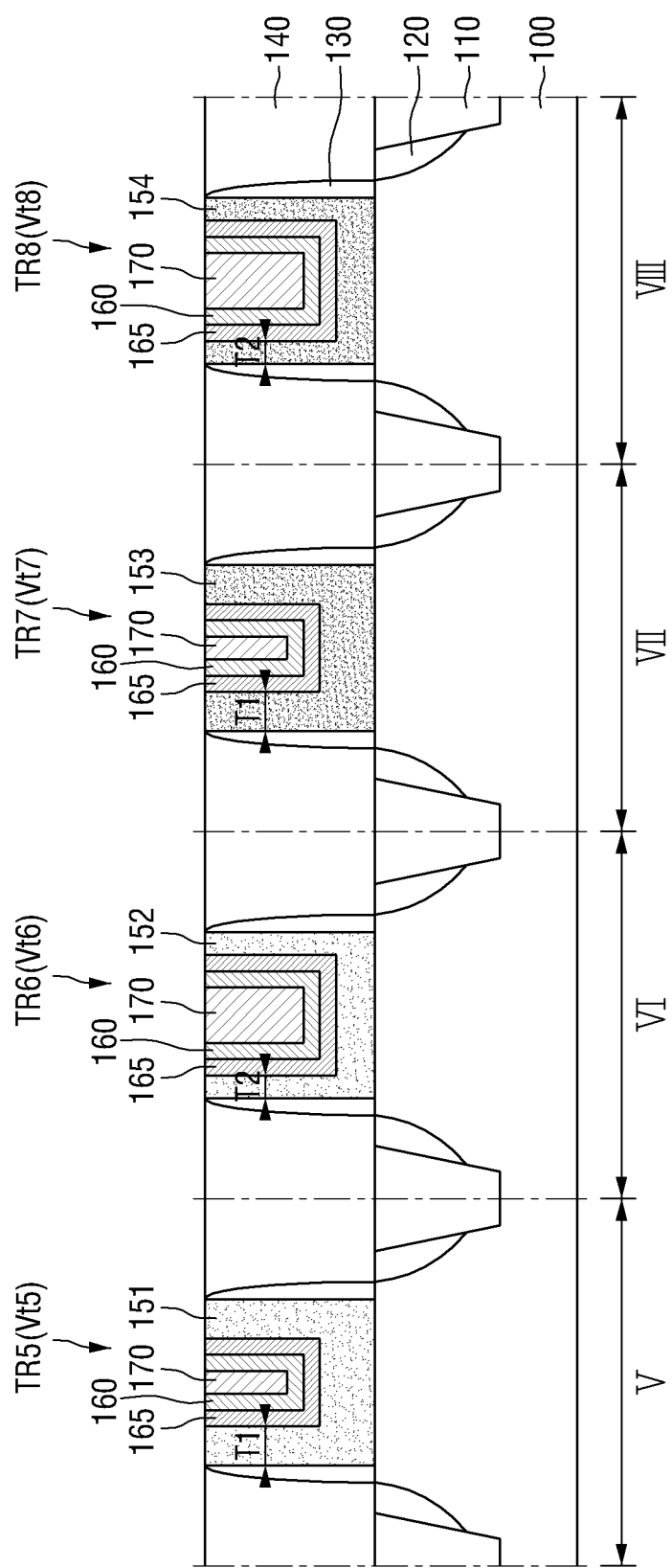
FIG. 3 is a cross-sectional view of a semiconductor device according to various embodiments of present inventive concepts.

FIG. 3 is a cross-sectional view of a semiconductor device 2 according to various embodiments of present inventive concepts. For simplicity, a redundant description of elements identical to those described with respect to FIGS. 1 and 2 may be omitted, and various embodiments may hereinafter be described, focusing mainly on differences with respect to FIGS. 1 and 2.

Referring to FIG. 3, a substrate 100 of the semiconductor device 2 may include fifth through eighth areas V through VIII. In some embodiments, fifth through eighth transistors TR5 through TR8 may be formed in the fifth through eighth areas V through VIII, respectively.

In some embodiments, the fifth through eighth transistors TR5 through TR8 may be p-channel metal oxide semiconductor (PMOS) transistors. Accordingly, each of the fifth through eighth transistors TR5 through TR8 may further include a p-type work function layer 165.

Specifically, the fifth transistor TR5 may include the p-type work function layer 165 disposed between a first gate insulating layer 151 and an n-type work function layer 160. The sixth transistor TR6 may include the p-type work function layer 165 disposed between a second gate insulating layer 152 and an n-type work function layer 160. The seventh transistor TR7 may include the p-type work function layer 165 disposed between a third gate insulating layer 153 and an n-type work function layer 160. The eighth transistor TR8 may include the p-type work function layer 165 disposed between a fourth gate insulating layer 154 and an n-type work function layer 160.

The p-type work function layer 165 may include, e.g., metal nitride. Specifically, in some embodiments of present inventive concepts, the p-type work function layer 165 may include at least one of Titanium Nitride (TiN) and Tantalum Nitride (TaN). More specifically, the p-type work function layer 165 may be, but is not limited to, a single layer made of TiN or a double layer composed of a TiN lower layer and a TaN upper layer.

In FIG. 3, the n-type work function layer 160 is formed on the p-type work function layer 165. However, the present disclosure is not limited thereto. For example, the n-type work function layer 160 can be omitted if necessary/desired.

If the fifth through eighth transistors TR5 through TR8 according to some embodiments are PMOS transistors, then p-type impurities may be injected into source-drain regions 120.

In some embodiments of present inventive concepts, the first gate insulating layer 151 and the second gate insulating layer 152 may be nitrided layers, and the nitrogen concentration of the first gate insulating layer 151 may be equal to that of the second gate insulating layer 152. In some embodiments of present inventive concepts, the third gate insulating layer 153 and the fourth gate insulating layer 154 may be unnitrided layers. In other words, the third gate insulating layer 153 and the fourth gate insulating layer 154 may not contain nitrogen.

Table 3 below compares threshold voltages Vt5 through Vt8 of the fifth through eighth transistors TR5 through TR8 in a case where the fifth through eighth transistors TR5 through TR8 are PMOS transistors, where lanthanum is used as the work function control material, and where the first and second gate insulating layers 151 and 152 have been nitrided, whereas the third and fourth gate insulating layers 153 and 154 have not been nitrided.

TABLE 3

| | TR5 | TR6 | TR7 | TR8 |
|---|---|---|---|---|
| Thickness of gate insulating layer | T1(>T2) | T2 | T1(>T2) | T2 |
| Nitrogen concentration of gate insulating layer | N1 | N1 | 0 | 0 |
| Amount of La contained in gate insulating layer | M1(<M2) | M1(<M2) | M2 | M2 |
| Threshold voltage | Vt5(>Vt6) | Vt6 | Vt7(>Vt8) | Vt8(>Vt5) |

Referring to Table 3 and FIG. 3, because the first gate insulating layer 151 and the third gate insulating layer 153 are thicker than the second gate insulating layer 152 and the fourth gate insulating layer 154, the threshold voltage Vt5 of the fifth transistor TR5 and the threshold voltage Vt7 of the seventh transistor TR7 may be higher than the threshold voltage Vt6 of the sixth transistor TR6 and the threshold voltage Vt8 of the eighth transistor TR8, respectively.

In addition, because the first gate insulating layer 151 and the second gate insulating layer 152 have been nitrided, whereas the third gate insulating layer 153 and the fourth gate insulating layer 154 have not been nitrided, the amount of lanthanum diffused to the third gate insulating layer 153 and the fourth gate insulating layer 154 may be greater than the amount of lanthanum diffused to the first gate insulating layer 151 and the second gate insulating layer 152.

Accordingly, the threshold voltage Vt7 of the seventh transistor TR7 and the threshold voltage Vt8 of the eighth transistor TR8 may be higher than the threshold voltage Vt5 of the fifth transistor TR5 and the threshold voltage Vt6 of the sixth transistor TR6.

In summary, the seventh transistor TR7 includes the third gate insulating layer 153 having a first thickness T1 and contains a large amount of lanthanum and has the highest threshold voltage Vt7, whereas the sixth transistor TR6 includes the second gate insulating layer 152 having a second thickness T2 and contains a small amount of lanthanum and has the lowest threshold voltage Vt6. In addition, the threshold voltage Vt8 of the eighth transistor TR8 including the fourth gate insulating layer 154, which has the relatively small second thickness T2 but contains a large amount of lanthanum, is higher than the threshold voltage Vt5 of the fifth transistor TR5 including the first gate insulating layer 151, which has the relatively great first thickness T1 but contains a small amount of lanthanum.

In other words, the fifth through eighth transistors TR5 through TR8 included in the semiconductor device 3 can be relatively easily controlled to have different threshold voltages. Moreover, in some embodiments of present inventive concepts, aluminum may be used as the work function control material.

Table 4 below compares the threshold voltages Vt5 through Vt8 of the fifth through eighth transistors TR5 through TR8 in a case where the fifth through eighth transistors TR5 through TR8 are PMOS transistors, where aluminum is used as the work function control material, and where the first and second gate insulating layers 151 and 152 have been nitrided, whereas the third and fourth gate insulating layers 153 and 154 have not been nitrided.

TABLE 4

| | TR5 | TR6 | TR7 | TR8 |
|---|---|---|---|---|
| Thickness of gate insulating layer | T1(>T2) | T2 | T1(>T2) | T2 |
| Nitrogen concentration of gate insulating layer | N1 | N1 | 0 | 0 |
| Amount of aluminum (Al) contained in gate insulating layer | M1(<M2) | M1(<M2) | M2 | M2 |
| Threshold voltage | Vt5(>Vt6) | Vt6(>Vt7) | Vt7(>Vt8) | Vt8 |

Referring to Table 4 and FIG. 3, because the first gate insulating layer 151 and the third gate insulating layer 153 are thicker than the second gate insulating layer 152 and the fourth gate insulating layer 154, the threshold voltage Vt5 of the fifth transistor TR5 and the threshold voltage Vt7 of the seventh transistor TR7 may be higher than the threshold voltage Vt6 of the sixth transistor TR6 and the threshold voltage Vt8 of the eighth transistor TR8, respectively.

In addition, because the first gate insulating layer 151 and the second gate insulating layer 152 have been nitride, whereas the third gate insulating layer 153 and the fourth gate insulating layer 154 have not been nitrided, the amount of aluminum diffused to the third gate insulating layer 153 and the fourth gate insulating layer 154 may be greater than the amount of aluminum diffused to the first gate insulating layer 151 and the second gate insulating layer 152.

Accordingly, the threshold voltage Vt7 of the seventh transistor TR7 and the threshold voltage Vt8 of the eighth transistor TR8 may be lower than the threshold voltage Vt5 of the fifth transistor TR5 and the threshold voltage Vt6 of the sixth transistor TR6.

In summary, the fifth transistor TR5 including the first gate insulating layer 151, which has the first thickness T1 and contains a small amount of aluminum, has the highest threshold voltage Vt5, and the eighth transistor TR8 including the fourth gate insulating layer 154, which has the second thickness T2 and contains a large amount of aluminum, has the lowest threshold voltage Vt8. In addition, the threshold voltage Vt6 of the sixth transistor TR6 including the second gate insulating layer 152, which has the relatively small second thickness T2 but contains a small amount of aluminum, is higher than the threshold voltage Vt7 of the seventh transistor TR7 including the third gate insulating layer 153, which has the relatively great first thickness T1 but contains a large amount of aluminum.

Some embodiments may also include the following case. In particular, the fifth through eighth transistors TR5 through TR8 may be PMOS transistors, and lanthanum may be used as the work function control material. In addition, all of the first through fourth gate insulating layers 151 through 154 may have been nitrided, and nitrogen concentrations of the third and fourth gate insulating layers 153 and 154 may be smaller than those of the first and second gate insulating layers 151 and 152. The threshold voltages Vt5 through Vt8 of the fifth through eighth transistors TR5 through TR8 in this case can be fully inferred by those of ordinary skill in the art from the above-described case where the fifth through eighth transistors TR5 through TR8 are NMOS transistors, and thus a redundant description thereof is omitted.

Figure 4:
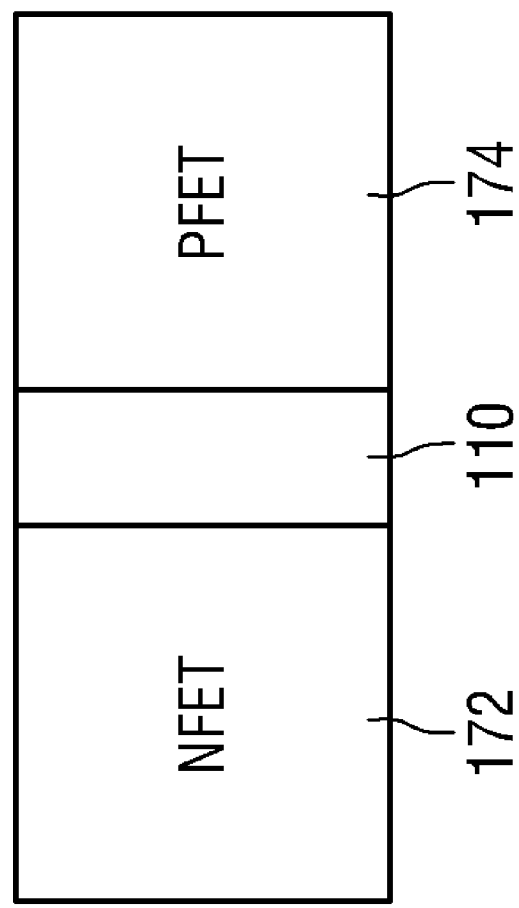
FIG. 4 is a schematic layout diagram of a semiconductor device according to various embodiments of present inventive concepts.

FIG. 4 is a schematic layout diagram of a semiconductor device 3 according to various embodiments of present inventive concepts. For simplicity, a redundant description of elements identical to those of FIGS. 1-3 may be omitted, and various embodiments will hereinafter be described, focusing mainly on differences with respect to FIGS. 1-3.

Referring to FIG. 4, the semiconductor device 3 may include an n-channel field effect transistor (NFET) area 172 and a p-channel field effect transistor (PFET) area 174. The NFET area 172 and the PFET area 174 may be separated by, e.g., an element isolation layer 110.

A plurality of NMOS transistors having different threshold voltages as illustrated in FIG. 1 may be formed in the NFET area 172. In addition, a plurality of PMOS transistors having different threshold voltages as illustrated in FIG. 3 may be formed in the PFET area 174.

In some embodiments of present inventive concepts, a gate insulating layer included in each of the NMOS transistors in the NFET area 172 and a gate insulating layer included in each of the PMOS transistors in the PFET area 174 may include lanthanum as a work function control material. Moreover, in some embodiments of present inventive concepts, the gate insulating layer included in each of the NMOS transistors in the NFET area 172 may include lanthanum as the work function control material, whereas the gate insulating layer included in each of the PMOS transistors in the PFET area 174 may include aluminum as the work function control material.

In some embodiments of present inventive concepts, the NMOS transistors in the NFET area 172 and the PMOS transistors in the PFET area 174 may form a complementary metal oxide semiconductor (CMOS) circuit.

Figure 5:
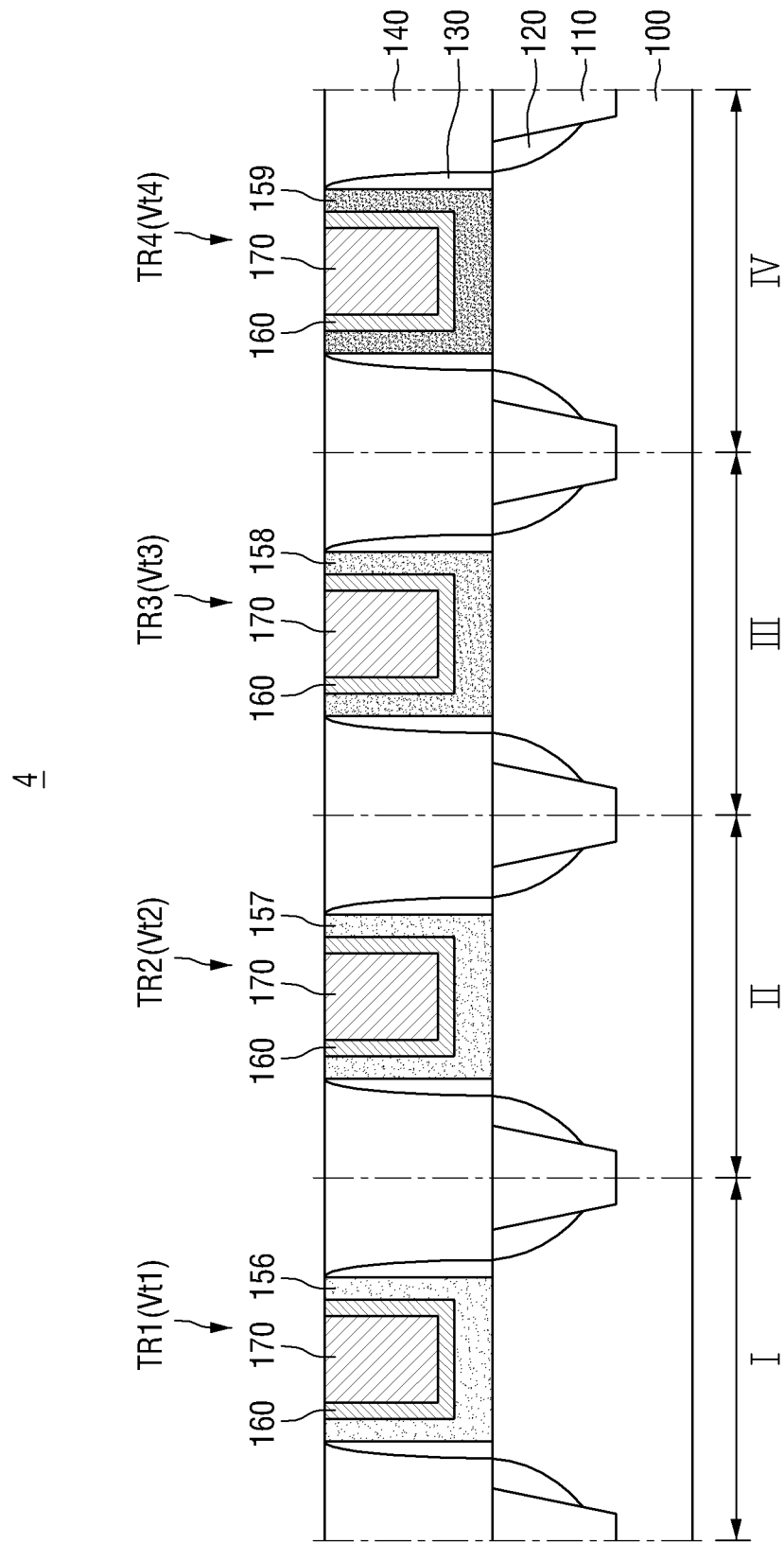
FIG. 5 is a cross-sectional view of a semiconductor device according to various embodiments of present inventive concepts.

FIG. 5 is a cross-sectional view of a semiconductor device 4 according to various embodiments of present inventive concepts. For simplicity, a redundant description of elements identical to those of FIGS. 1-4 may be omitted, and further embodiments will hereinafter be described, focusing mainly on differences with respect to FIGS. 1-4.

Referring to FIG. 5, a substrate 100 of the semiconductor device 4 may include first through fourth areas I through IV. In some embodiments, first through fourth transistors TR1 through TR4 may be formed in the first through fourth areas I through IV of the substrate 100, respectively.

In some embodiments of present inventive concepts, first and second gate insulating layers 156 and 157 may contain nitrogen, and third and fourth gate insulating layers 158 and 159 may not contain nitrogen.

The first through fourth gate insulating layers 156 through 159 may have equal thicknesses, as illustrated in the drawing. In addition, the first through fourth gate insulating layers 156 through 159 may contain different amounts of a work function control material. Specifically, the amount of the work function control material contained in the first gate insulating layer 156 may be smaller than the amount of the work function control material contained in the second gate insulating layer 157. The amount of the work function control material contained in the second gate insulating layer 157 may be smaller than the amount of the work function control material contained in the third gate insulating layer 158. The amount of the work function control material contained in the third gate insulating layer 158 may be smaller than the amount of the work function control material contained in the fourth gate insulating layer 159.

Accordingly, if the first through fourth transistors TR1 through TR4 are NMOS transistors and if the work function control material is lanthanum, a threshold voltage Vt1 of the first transistor TR1 may be higher than a threshold voltage Vt2 of the second transistor TR2, the threshold voltage Vt2 of the second transistor TR2 may be higher than a threshold voltage Vt3 of the third transistor TR3, and the threshold voltage Vt3 of the third transistor TR3 may be higher than a threshold voltage Vt4 of the fourth transistor TR4.

On the other hand, if the first through fourth transistors TR1 through TR4 are PMOS transistors and if the work function control material is lanthanum, the threshold voltage Vt1 of the first transistor TR1 may be lower than the threshold voltage Vt2 of the second transistor TR2, the threshold voltage Vt2 of the second transistor TR2 may be lower than the threshold voltage Vt3 of the third transistor TR3, and the threshold voltage Vt3 of the third transistor TR3 may be lower than the threshold voltage Vt4 of the fourth transistor TR4.

If the first through fourth transistors TR1 through TR4 are PMOS transistors and if the work function control material is aluminum, the threshold voltage Vt1 of the first transistor TR1 may be higher than the threshold voltage Vt2 of the second transistor TR2, the threshold voltage Vt2 of the second transistor TR2 may be higher than the threshold voltage Vt3 of the third transistor TR3, and the threshold voltage Vt3 of the third transistor TR3 may be higher than the threshold voltage Vt4 of the fourth transistor TR4.

Methods of fabricating semiconductor devices (e.g., the semiconductor device 4) is described herein. For example, FIGS. 6 through 9 are views illustrating a method of fabricating a semiconductor device according to various embodiments of present inventive concepts.

Figure 6:
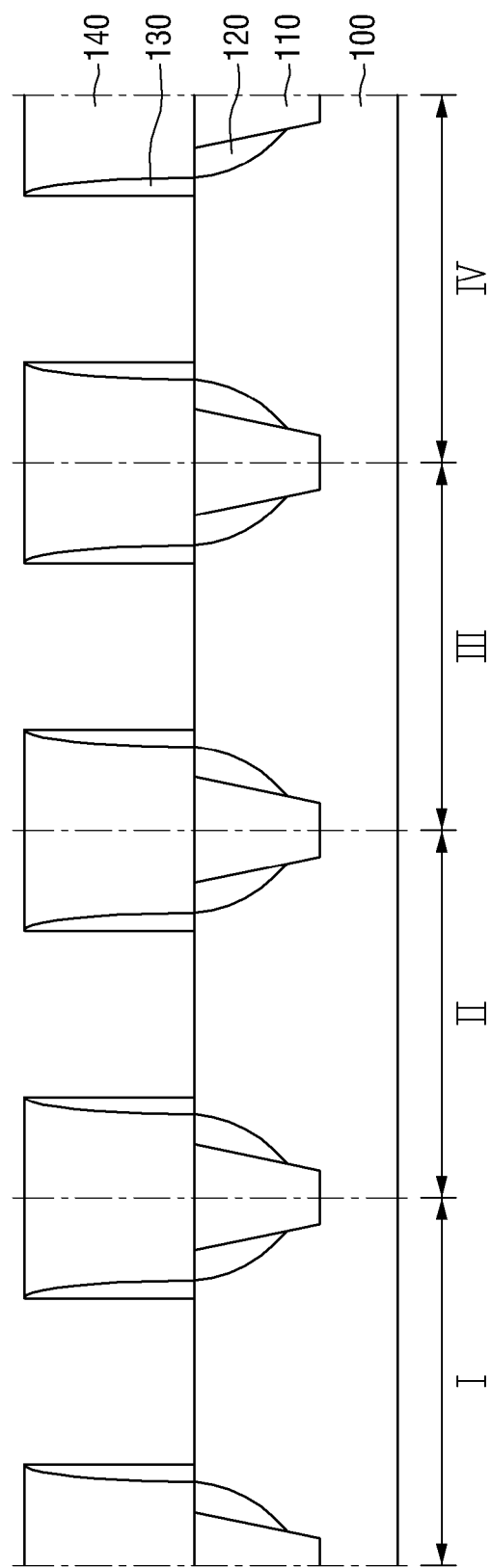
FIGS. 6 through 9 are views illustrating a method of fabricating a semiconductor device according to various embodiments of present inventive concepts.

Referring to FIG. 6, a substrate 100 including first through fourth areas I through IV is provided. Here, the first through fourth areas I through IV of the substrate 100 may be separated by element isolation layers 110, as illustrated in the drawing.

The substrate 100 may be, for example, a bulk silicon substrate or an SOI substrate formed by epitaxially growing silicon on an insulator. In some embodiments of present inventive concepts, the substrate 100 may be a substrate having an epitaxial layer formed in the shape of fins on a base substrate. In this case, the substrate 100 illustrated in FIG. 6 may be upper parts of the fins.

Here, the epitaxial layer may include a single-element semiconductor material such as silicon or germanium. Moreover, the epitaxial layer may include a compound semiconductor such as a group IV-IV compound semiconductor or a group III-V compound semiconductor. Specifically, the group IV-IV compound semiconductor that can be used to form the epitaxial layer may be a binary or ternary compound containing two or more of carbon (C), silicon (Si), germanium (Ge) and tin (Sn) or a compound obtained by doping the binary or ternary compound with a group IV element. The group III-V compound semiconductor that can be used to form the epitaxial layer may be one of a binary compound, a ternary compound, and a quaternary compound formed by combining at least one of aluminum (Al), gallium (Ga) and indium (In), which are group III elements, with one of phosphorus (P), arsenic (As) and antimony (Sb), which are group V elements.

Next, dummy gates are formed of, e.g., polysilicon on the substrate 100. Then, spacers 130 including at least one of a nitride layer and an oxynitride layer are formed on both sides of each of the dummy gates.

Source-drain regions 120 are formed by injecting impurities into the substrate 100 using the dummy gates and the spacers 130 as a mask. The source-drain regions 120 may also be formed by epitaxial growth as described above. In this case, the source-drain regions 120 may be formed in recesses formed in the substrate 100. After the formation of the source-drain regions 120, an interlayer insulating film 140 is formed to cover the dummy gates and the spacers 130. The interlayer insulating film 140 is then planarized until the dummy gates are exposed.

The exposed dummy gates are removed after planarizing the interlayer insulating film 140. Accordingly, trenches are formed on the first through fourth areas I through IV, respectively, as illustrated in FIG. 6.

Figure 7:
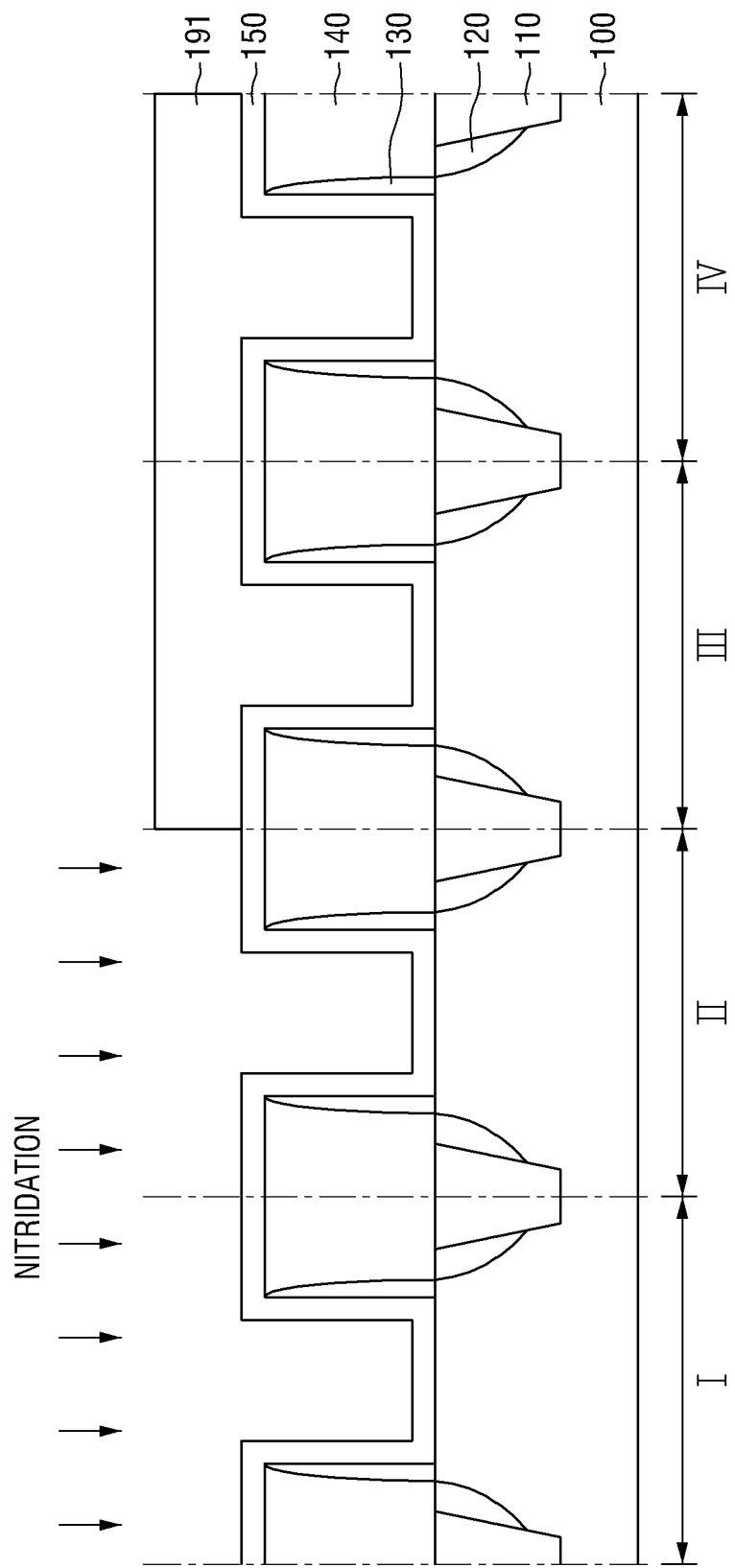

Referring to FIG. 7, a gate insulating layer 150 is formed on the first through fourth areas I through IV. Here, the gate insulating layer 150 may be formed to conformally fill the trenches formed on the first through fourth areas I through IV, respectively. Accordingly, part of the gate insulating layer 150 may extend upward along sidewalls of the spacers 130, as illustrated in the drawing.

A mask 191 is formed on the third and fourth areas III and IV. Then, the substrate 100 is nitrided using, e.g., a chamber. Here, because the mask 191 has been formed on the third and fourth areas III and IV, the gate insulating layer 150 formed on the first and second areas I and II may be nitrided, whereas the gate insulating layer 150 formed on the third and fourth areas III and IV may not be nitrided. In other words, the nitridation of the substrate 100 may produce a first gate insulating layer 151 and a second gate insulating layer 152 that contain nitrogen, and a third gate insulating layer 153 and a fourth gate insulating layer 154 that do not contain nitrogen, as illustrated in FIG. 1 and Table 1.

In some embodiments, the mask 191 formed on the third and fourth areas III and IV may be removed, and a mask may be formed on the first and second areas I and II. Then, the substrate 100 may be nitrided using, e.g., a chamber. In this case, the first through fourth gate insulating layers 151 through 154, which have all been nitride, may be fabricated.

Here, if a nitrogen concentration in the subsequent nitridation process is set low, although all of the first through fourth gate insulating layers 151 through 154 are nitrided layers, nitrogen concentrations of the third gate insulating layer 153 and the fourth gate insulating layer 154 may be lower than those of the first gate insulating layer 151 and the second gate insulating layer 152.

Figure 8:
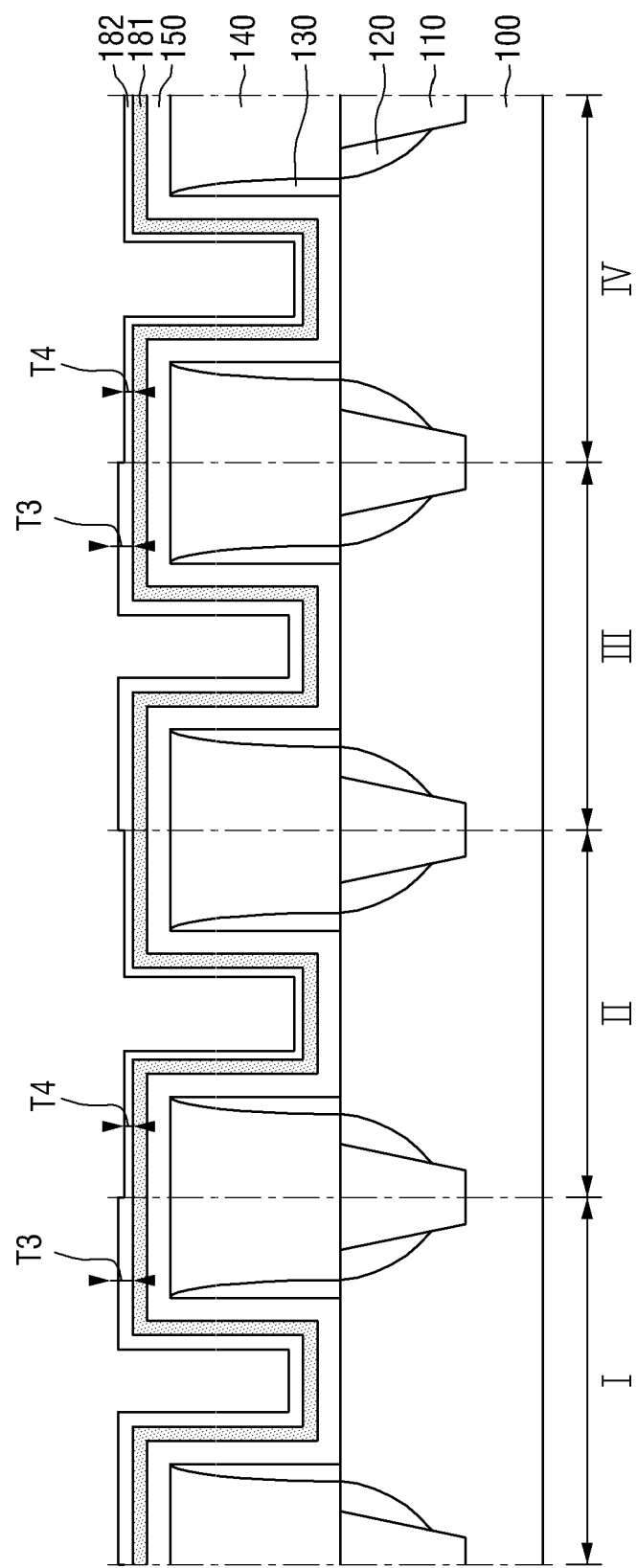

Referring to FIG. 8, a work function control material providing layer 181 is formed on the gate insulating layer 150. In some embodiments of present inventive concepts, the work function control material providing layer 181 may include, for example, lanthanum. In some embodiments of present inventive concepts, the work function control material providing layer 181 may include, for example, aluminum.

A first capping layer 182 is formed on the work function control material providing layer 181. Then, the first capping layer 182 formed on the second area II and the fourth area IV is partially etched. Accordingly, a thickness T4 of the first capping layer 182 formed on the second area II and the fourth area IV may become smaller than a thickness T3 of the first capping layer 182 formed on the first area I and the third area III. In some embodiments of present inventive concepts, the first capping layer 182 may include, but is not limited to, TiN.

Referring to FIG. 9, a second capping layer 183 is formed on the first capping layer 182. In some embodiments of present inventive concepts, the second capping layer 183 may include, but is not limited to, amorphous silicon (or another semiconductor material).

Next, the substrate 100 is annealed. The annealing of the substrate 100 may cause the work function control material contained in the work function control material providing layer 181 to diffuse to the gate insulating layer 150. Here, because the gate insulating layer 150 formed on the first area I and the second area II of the substrate 100 has been nitrided, the amount of the work function control material diffused to the gate insulating layer 150 formed on the first area I and the second area II may be smaller than the amount of the work function control material diffused to the gate insulating layer 150 formed on the third area III and the fourth area IV.

In addition, because the thickness T3 of the first capping layer 182 formed on the first area I and the third area III is greater (i.e., thicker) than the thickness T4 of the first capping layer 182 formed on the second area II and the fourth area IV, more oxygen may be supplied during the annealing process to the gate insulating layer 150 formed on the first area I and the third area III than to the gate insulating layer 150 formed on the second area II and the fourth area IV. Accordingly, the gate insulating layer 150 formed on the first area I and the third area III may become thicker than the gate insulating layer 150 formed on the second area II and the fourth area IV as illustrated in FIG. 1.

Accordingly, the annealing process of FIG. 9 may produce the first through fourth gate insulating layers 151 through 154 having different thicknesses and different amounts of the work function control material as illustrated in FIG. 1.

The first and second capping layers 182 and 183 and the work function control material providing layer 181 are removed, and n-type work function layers 160 and gate metals 170 are formed. As a result, the semiconductor device 1 illustrated in FIG. 1 may be fabricated.

Figure 10:
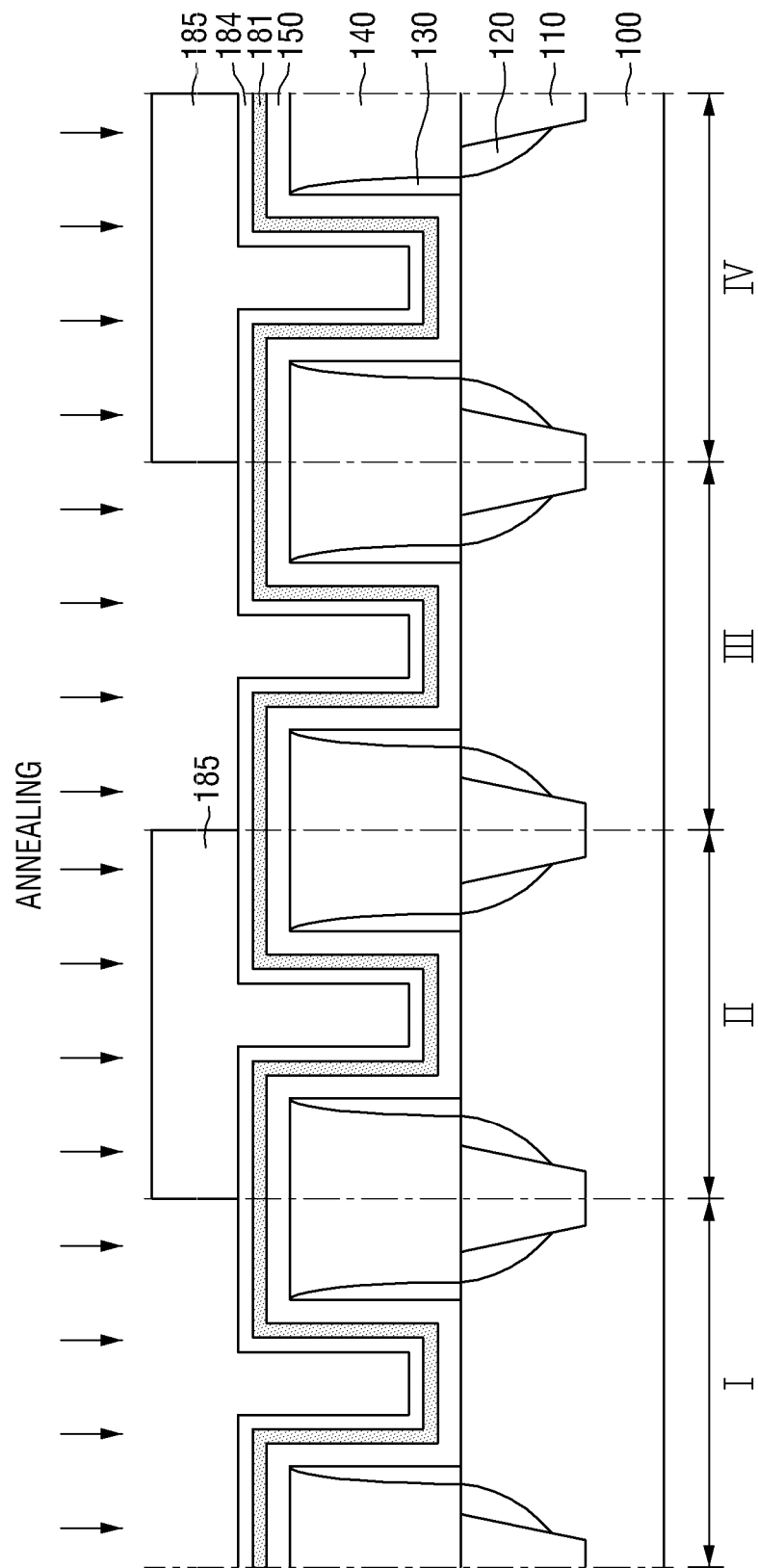
FIG. 10 is a view illustrating a method of fabricating a semiconductor device according to various embodiments of present inventive concepts.

FIG. 10 is a view illustrating a method of fabricating a semiconductor device according to various embodiments of present inventive concepts. For simplicity, a redundant description of elements and processes identical to those of FIGS. 1-9 may be omitted, and various embodiments will hereinafter be described, focusing mainly on differences with respect to FIGS. 1-9.

Referring to FIG. 10, in some embodiments, a first capping layer 184 is formed to a uniform thickness across first through fourth areas I through IV of a substrate 100.

After a second capping layer 185 is formed on the first capping layer 184, the second capping layer 185 formed on the first and third areas I and III of the substrate 100 is removed. Then, the substrate 100 is annealed. Here, because the second capping layer 185, which blocks external oxygen in the annealing process, has been removed from the first and third areas I and III, more oxygen is provided to a gate insulating layer 150 formed on the first and third areas I and III of the substrate 100 than to the gate insulating layer 150 formed on the second and fourth areas II and IV of the substrate 100. Accordingly, the gate insulating layer 150 formed on the first area I and the third area III may become thicker than the gate insulating layer 150 formed on the second area II and the fourth area IV, as illustrated in FIG. 1.

In other words, the annealing process of FIG. 10 may produce first through fourth gate insulating layers 151 through 154 having different thicknesses and different amounts of a work function control material, as illustrated in FIG. 1.

Figure 11:
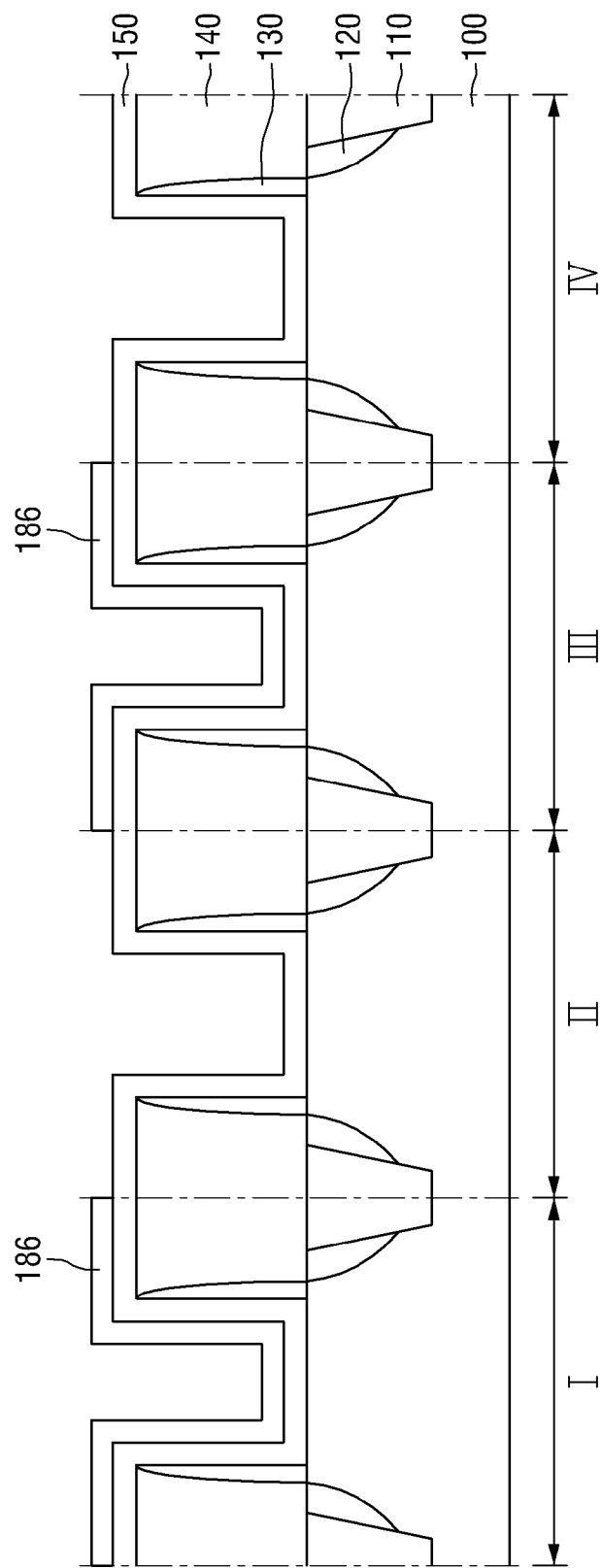
FIGS. 11 and 12 are views illustrating a method of fabricating a semiconductor device according to various embodiments of present inventive concepts.
Figure 12:
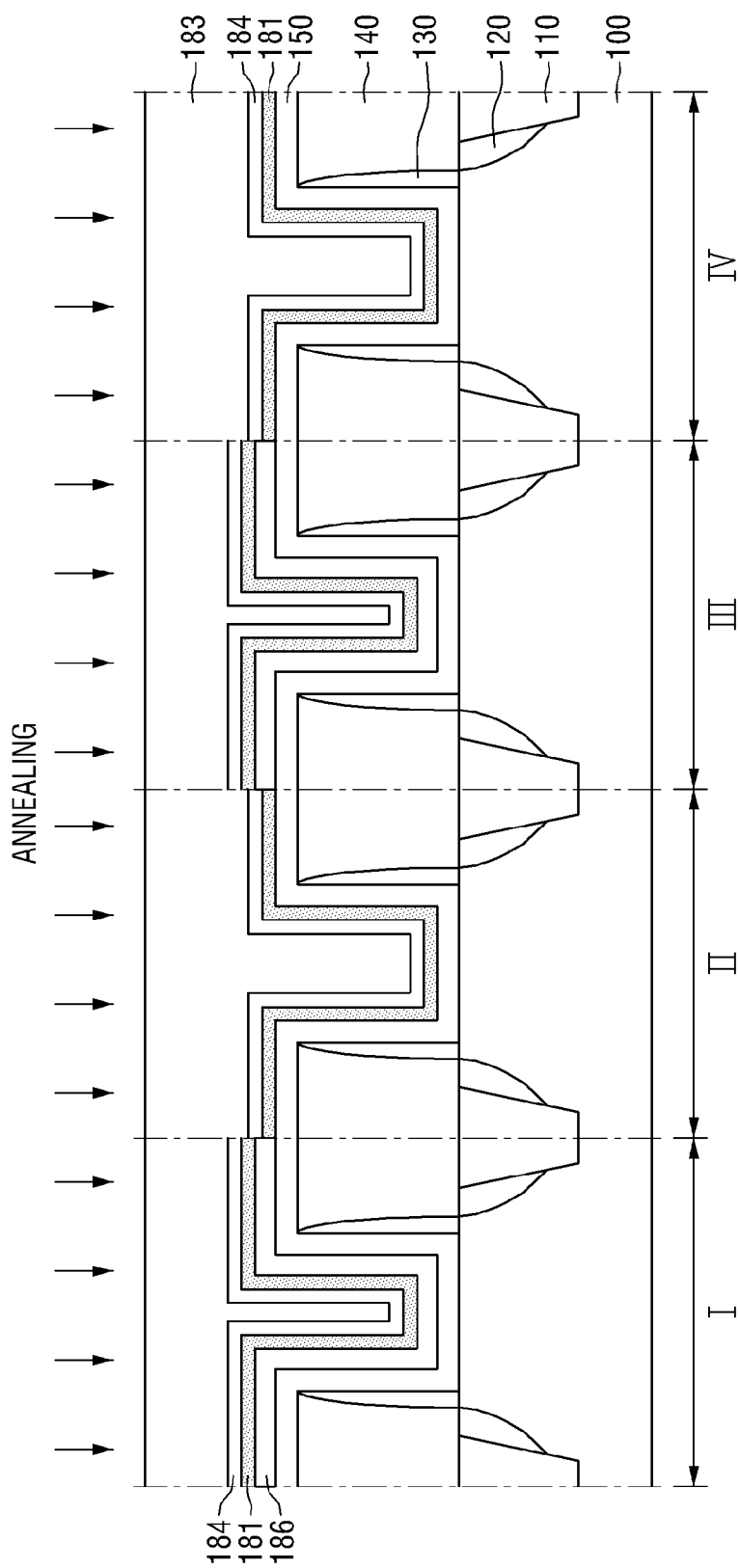

FIGS. 11 and 12 are views illustrating a method of fabricating a semiconductor device according to various embodiments of present inventive concepts. For simplicity, a redundant description of elements and processes identical to those of FIGS. 1-10 may be omitted, and various embodiments will hereinafter be described, focusing mainly on differences with respect to FIGS. 1-10.

Referring to FIG. 11, a gate insulating layer 150 is formed on first through fourth areas I through IV of a substrate 100. Then, the gate insulating layer 150 is nitrided as illustrated in FIG. 7, and a blocking layer 186 is formed on the gate insulating layer 150. Here, the blocking layer 186 may include, but is not limited to, TiN. The blocking layer 186 formed on the second and fourth areas II and IV of the substrate 100 is removed.

Referring to FIG. 12, a work function control material providing layer 181 is formed on the gate insulating layer 150 and the blocking layer 186. Then, a first capping layer 184 and a second capping layer 183 are formed sequentially on the work function control material providing layer 181.

Next, the substrate 100 is annealed. The annealing of the substrate 100 may cause a work function control material contained in the work function control material providing layer 181 to diffuse to the gate insulating layer 150. Here, because the gate insulating layer 150 formed on the first area I and the second area II of the substrate 100 have been nitrided, the amount of the work function control material diffused to the gate insulating layer 150 formed on the first area I and the second area II of the substrate 100 may be smaller than the amount of the work function control material diffused to the gate insulating layer 150 formed on the third area III and the fourth area IV of the substrate 100.

In addition, because the blocking layer 186 has been formed on the first and third areas I and III of the substrate 100, the amount of the work function control material diffused to the gate insulating layer 150 formed on the first area I and the third area III of the substrate 100 may be smaller than the amount of the work function control material diffused to the gate insulating layer 150 formed on the second area II and the fourth area IV of the substrate 100.

In summary, the amount of the work function control material diffused to the gate insulating layer 150 formed on the first area I of the substrate 100 is smaller than the amount of the work function control material diffused to the gate insulating layer 150 formed on the second area II of the substrate 100, the amount of the work function control material diffused to the gate insulating layer 150 formed on the second area II of the substrate 100 is smaller than the amount of the work function control material diffused to the gate insulating layer 150 formed on the third area III of the substrate 100, and the amount of the work function control material diffused to the gate insulating layer 150 formed on the third area III of the substrate 100 is smaller than the amount of the work function control material diffused to the gate insulating layer 150 formed on the fourth area IV of the substrate 100.

Accordingly, the annealing process of FIG. 12 may produce first through fourth gate insulating layers 156 through 159 having equal thicknesses but different amounts of the work function control material, as illustrated in FIG. 5.

As described herein, in methods of fabricating a semiconductor device according to various embodiments of present inventive concepts, selectively nitriding a gate insulating layer 150 may be combined variously with selectively adjusting the thickness of a first capping layer 182 (see FIG. 8), selectively forming a second capping layer 185 (see FIG. 10), and selectively forming a blocking layer 186 (see FIG. 11). Therefore, a plurality of transistors having different threshold voltages can be fabricated relatively simply at relatively low costs.

Figure 13:
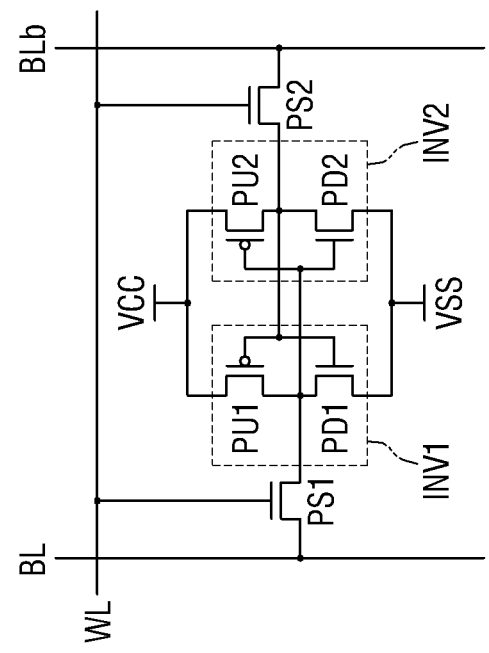
FIG. 13 is a circuit diagram of a semiconductor device according to various embodiments of present inventive concepts.
Figure 14:
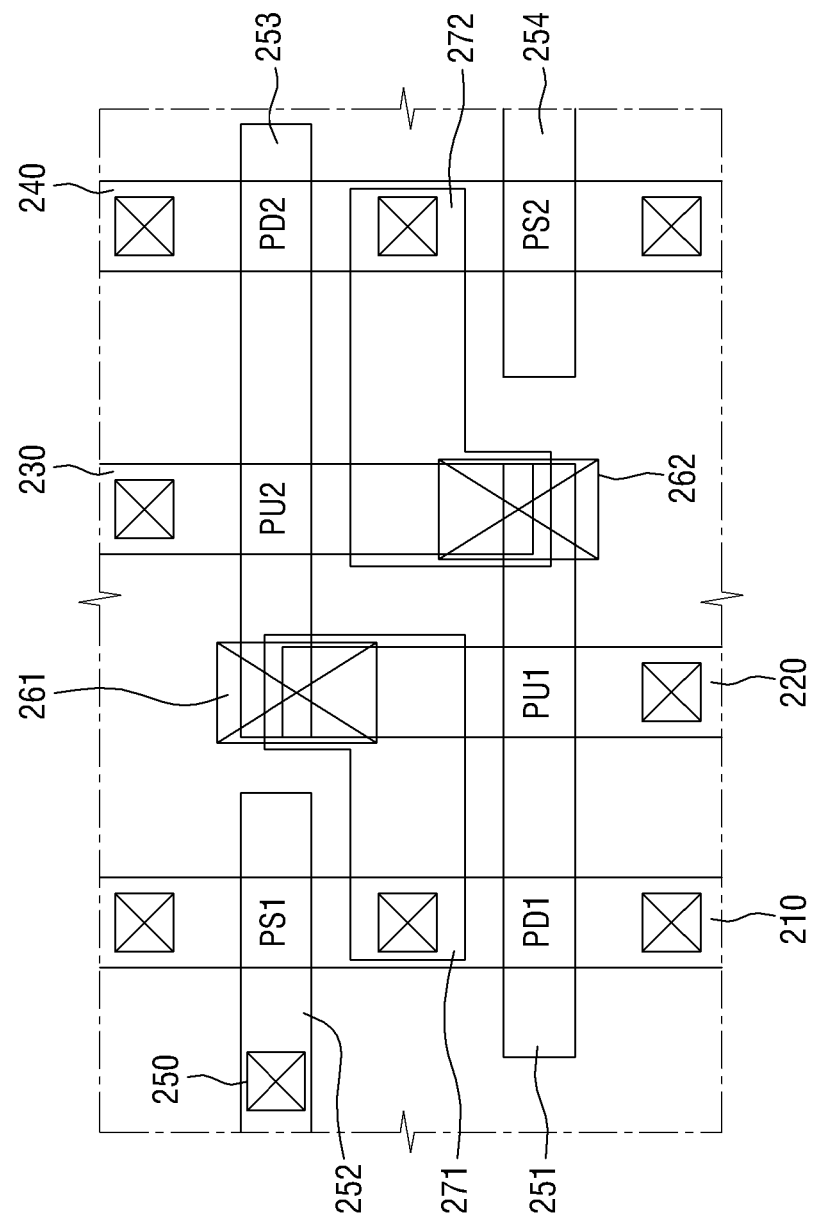
FIG. 14 is a layout diagram of the semiconductor device illustrated in FIG. 13.

FIG. 13 is a circuit diagram of a semiconductor device 5 according to various embodiments of present inventive concepts. FIG. 14 is a layout diagram of the semiconductor device 5 illustrated in FIG. 13. For simplicity, a redundant description of elements identical to those of FIGS. 1-12 may be omitted, and further embodiments will hereinafter be described, focusing mainly on differences with respect to FIGS. 1-12.

Referring to FIGS. 13 and 14, the semiconductor device 5 may include a pair of first and second inverters INV1 and INV2 connected in parallel between a power source node VCC and a ground node VSS and first and second pass transistors PS1 and PS2 respectively connected to output nodes of the first and second inverters INV1 and INV2. The first and second pass transistors PS1 and PS2 may be connected to a bit line BL and a complementary bit line BLb, respectively. Gates of the first and second pass transistors PS1 and PS2 may be connected to a word line WL.

The first inverter INV1 includes a first pull-up transistor PU1 and a first pull-down transistor PD1 connected in series, and the second inverter INV2 includes a second pull-up transistor PU2 and a second pull-down transistor PD2 connected in series. The first and second pull-up transistors PU1 and PU2 may be PFETs, and the first and second pull-down transistors PD1 and PD2 may be NFETs.

An input node of the first inverter INV1 is connected to the output node of the second inverter INV2, and an input node of the second inverter INV2 is connected to the output node of the first inverter INV1, such that the first and second inverters INV1 and INV2 may form a single latch circuit.

Referring again to FIGS. 13 and 14, a first active fin 210, a second active fin 220, a third active fin 230, and a fourth active fin 240 may extend in a direction (e.g., a vertical direction in FIG. 14) to be separated from each other. The second active fin 220 and the third active fin 230 may be shorter than the first active fin 210 and the fourth active fin 240.

In addition, a first gate electrode 251, a second gate electrode 252, a third gate electrode 253, and a fourth gate electrode 254 may extend in another direction (e.g., a horizontal direction in FIG. 14) to intersect the first through fourth active fins 210 through 240. Specifically, the first gate electrode 251 may completely intersect the first active fin 210 and the second active fin 220, and may partially overlap an end of the third active fin 230. The third gate electrode 253 may completely intersect the fourth active fin 240 and the third active fin 230, and may partially overlap an end of the second active fin 220. The second gate electrode 252 and the fourth gate electrode 254 may intersect the first active fin 210 and the fourth active fin 240, respectively.

The first pull-up transistor PU1 may be defined near the intersection of the first gate electrode 251 and the second active fin 220. The first pull-down transistor PD1 may be defined near the intersection of the first gate electrode 251 and the first active fin 210. The first pass transistor PSI may be defined near the intersection of the second gate electrode 252 and the first active fin 210. The second pull-up transistor PU2 may be defined near the intersection of the third gate electrode 253 and the third active fin 230. The second pull-down transistor PD2 may be defined near the intersection of the third gate electrode 253 and the fourth active fin 240. The second pass transistor PS2 may be defined near the intersection of the fourth gate electrode 254 and the fourth active fin 240.

In some embodiments, source-drain regions may be formed on both sides of each of the intersections between the first through fourth gate electrodes 251 through 254 and the first through fourth active fins 210 through 240, respectively. A plurality of contacts 250 may also be formed.

A first shared contact 261 may connect all of the second active fin 220, the third gate electrode 253, and a wiring 271. A second shared contact 262 may connect all of the third active fin 230, the first gate electrode 251, and a wiring 272.

The semiconductor device 5 may be used as, for example, a static random access memory (SRAM). At least one of the transistors PU1 and PU2, PD1 and PD2, and PS1 and PS2 included in the semiconductor device 5 may employ structures according to the above-described embodiments with respect to FIGS. 1-12. For example, the first and second pass transistors PS1 and PS2 of FIG. 14 may be formed in the structure of any one of the NMOS transistors TR1 through TR4 illustrated in FIG. 1, and the first and second pull-down transistors PD1 and PD2 may be formed in the structure of another one of the NMOS transistors TR1 through TR4 illustrated in FIG. 1. In addition, the first and second pull-up transistors PU1 and PU2 of FIG. 14 may be formed in the structure of any one of the PMOS transistors TR5 through TR8 illustrated in FIG. 3.

Figure 16:
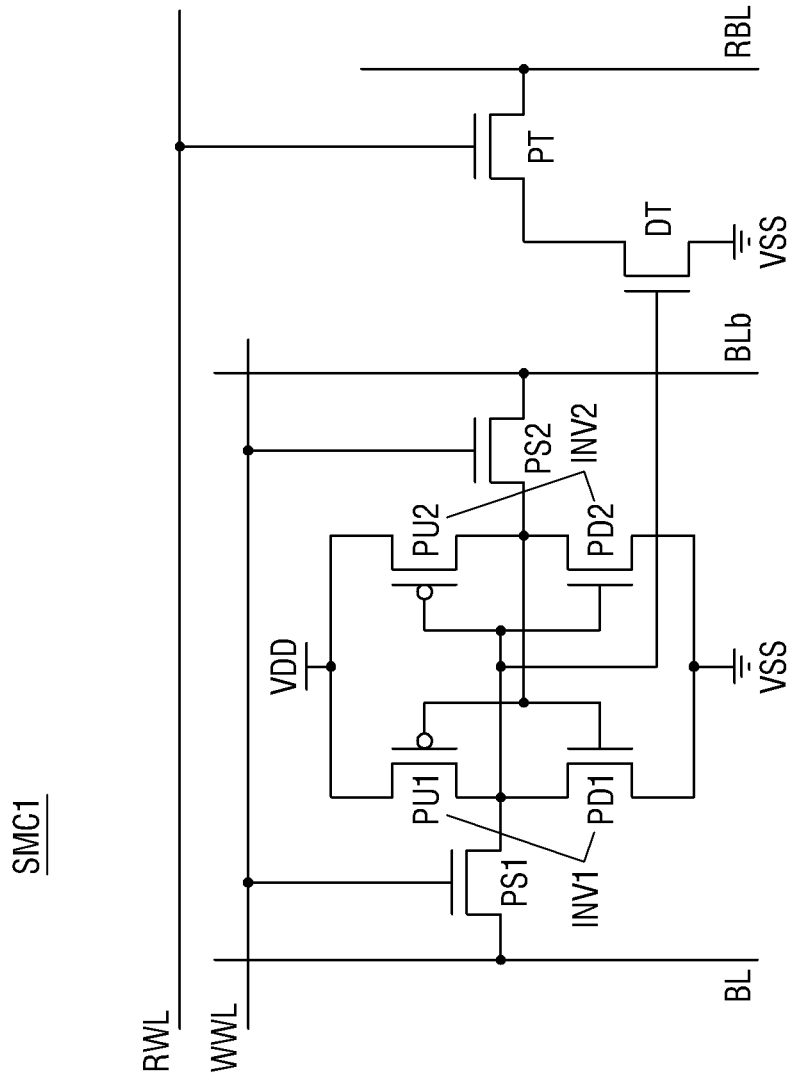
FIG. 16 is a circuit diagram of a first SRAM cell region illustrated in FIG. 15.
Figure 17:
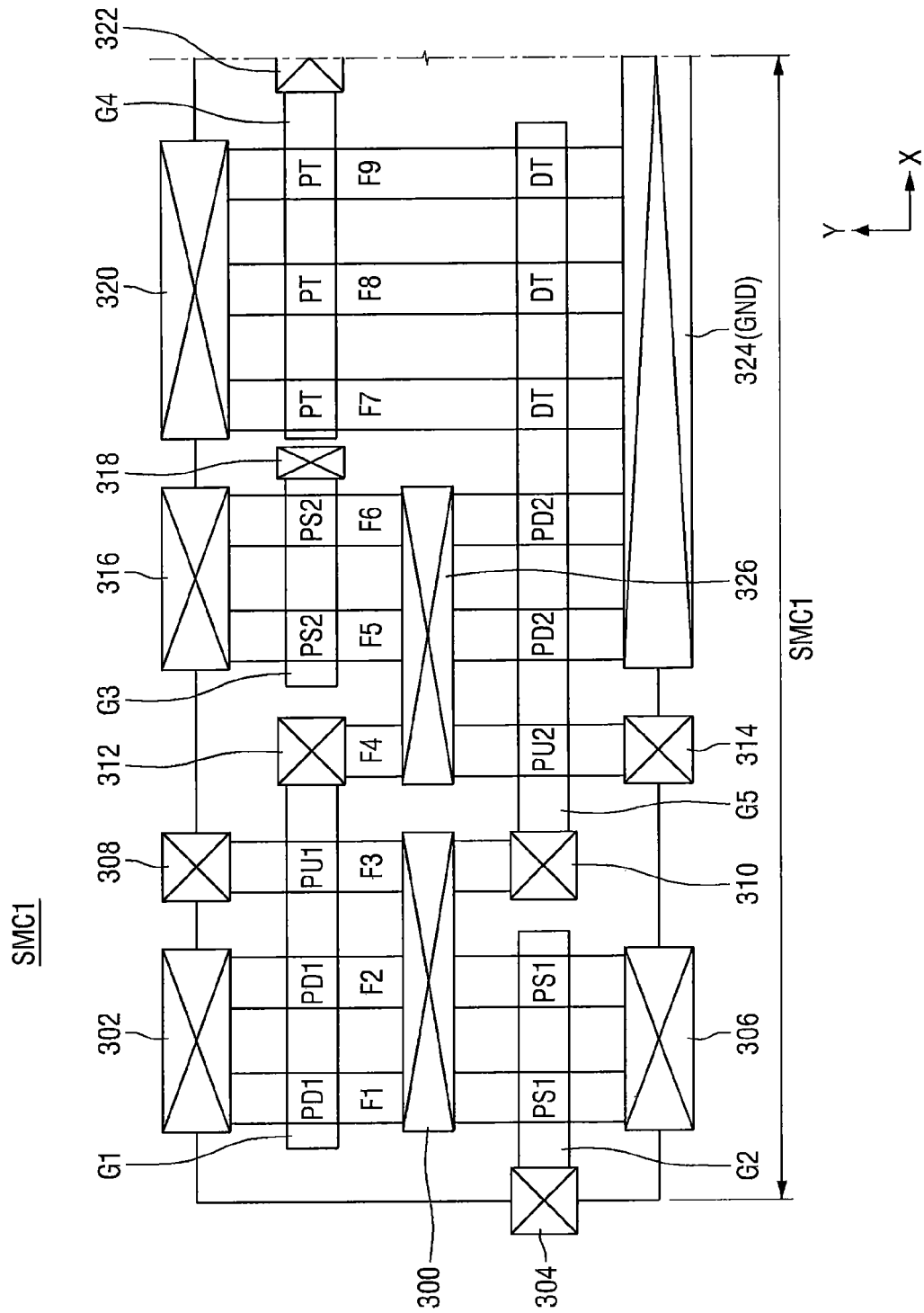
FIG. 17 is a layout diagram of the first SRAM cell region illustrated in FIG. 15.

FIG. 15 is a conceptual diagram of a semiconductor device 6 according to various embodiments of present inventive concepts. FIG. 16 is a circuit diagram of a first SRAM cell region SMC1 illustrated in FIG. 15. FIG. 17 is a layout diagram of the first SRAM cell region SMC1 illustrated in FIG. 15. For simplicity, a redundant description of elements identical to those of FIGS. 1-14 may be omitted, and various embodiments will hereinafter be described, focusing mainly on differences with respect to FIGS. 1-14.

Although an example in which SRAM elements are disposed in each memory cell array region MR is described herein, the present disclosure is not limited to this example. In addition, although an example in which 8 SRAM elements, each including 8 transistors, are disposed in each memory cell array region MR is described herein, the present disclosure is not limited to this example.

Referring to FIG. 15, a plurality of SRAM cell regions (e.g., SMC1, SMC2, etc.) may be disposed in a memory cell array region MR of the semiconductor device 6. The SRAM cell regions may be arranged in a lattice pattern to form an array.

Referring to FIG. 16, each SRAM cell region (e.g., the first SRAM cell region SMC1) may include a pair of first and second inverters INV1 and INV2 connected in parallel between a power source node VDD and a ground node VSS, first and second select transistors PS1 and PS2 respectively connected to output nodes of the first and second inverters INV1 and INV2, a drive transistor DT controlled by an output of the first inverter INV1, and a pass transistor PT connected to an output node of the drive transistor DT. Accordingly, in some embodiments, each SRAM cell region (e.g., the first SRAM cell region SMC1) may include an SRAM element including eight transistors.

The first and second select transistors PS1 and PS2 may be connected to a bit line BL and a complementary bit line BLb, respectively. Gates of the first and second select transistors PS1 and PS2 may be connected to a write word line WWL.

The first inverter INV1 includes a first pull-up transistor PU1 and a first pull-down transistor PD1 connected in series, and the second inverter INV2 includes a second pull-up transistor PU2 and a second pull-down transistor PD2 connected in series. The first and second pull-up transistors PU1 and PU2 may be PFETs, and the first and second pull-down transistors PD1 and PD2 may be NFETs.

An input node of the first inverter INV1 may be connected to the output node of the second inverter INV2, and an input node of the second inverter INV2 may be connected to the output node of the first inverter INV1, such that the first and second inverters INV1 and INV2 form a single latch circuit.

The drive transistor DT and the pass transistor PT may be used to read data stored in the latch circuit formed by the first inverter INV1 and the second inverter INV2. A gate of the drive transistor DT may be connected to the output node of the first inverter INV1, and a gate of the pass transistor PT may be connected to a read word line RWL. An output of the drive transistor DT may be connected to the ground node VSS, and an output of the pass transistor PT may be connected to a read bit line RBL.

The above circuit configuration of the semiconductor device 6 according to some embodiments makes it possible to access data stored in an SRAM element through two ports (e.g., a double port). First, by selecting the write word line WWL, the bit line BL, and the complementary bit line BLb, it is possible to write data to the latch circuit formed by the first inverter INV1 and the second inverter INV2 or to read data stored in the latch circuit. That is, this path can be used as a first port. In addition, by selecting the read word line RWL and the read bit line RBL, it is possible to read data stored in the latch circuit formed by the first inverter INV1 and the second inverter INV2. That is, this path can be used as a second port.

In the SRAM element, an operation of reading data through the second port can be performed independently of an operation of writing data through the first port. Therefore, the operation of reading data may not affect data stored in the latch circuit. In other words, the operation of reading data stored in the latch circuit and the operation of writing data to the latch circuit can be performed independently.

Referring additionally to FIG. 17, each SRAM cell region (e.g., the first SRAM cell region SMC1) may include nine active fins (F1 through F9), five gate electrodes (G1 through G5), and a plurality of contacts (300, 302, 304, 306, 308, 310, 312, 314, 316, 318, 320, 322, 324 and 326).

First through ninth active fins F1 through F9 may extend in a first direction Y.

A first gate electrode G1 may overlap the first through third active fins F1 through F3 and may extend in a second direction X. The first pull-down transistor PD1 may be formed at each of the intersections of the first and second active fins F1 and F2 with the first gate electrode G1. The first pull-up transistor PU1 may be formed at the intersection of the third active fin F3 with the first gate electrode G1.

A source of the first pull-down transistor PD1 may be connected to a second contact 302. The second contact 302 may be connected to the ground node VSS. A source of the first pull-up transistor PU1 may be connected to a fifth contact 308. The fifth contact 308 may be connected to the power source node VDD. A drain of the first pull-down transistor PD1 and a drain of the first pull-up transistor PU1 may be connected to a first contact 300. That is, the first pull-down transistor PD1 and the first pull-up transistor PU1 may share the first contact 300.

The first select transistor PS1 may be formed at each of the intersections of the first and second active fins F1 and F2 with a second gate electrode G2. A drain of the first select transistor PS1 may be connected to the first contact 300. That is, the first pull-down transistor PD1, the first pull-up transistor PU1, and the first select transistor PS1 may share the first contact 300. A source of the first select transistor PS1 may be connected to a fourth contact 306. The fourth contact 306 may be connected to the bit line BL. The second gate electrode G2 may be connected to a third contact 304. The third contact 304 may be connected to the write word line WWL.

The first pull-down transistor PD1 and the first select transistor PS1 may be formed using two active fins F1 and F2, and the first pull-up transistor PU1 may be formed using one active fin F3. Therefore, the first pull-down transistor PD1 and the first select transistor PS1 may be larger than the first pull-up transistor PU1.

A sixth contact 310 may be connected to the first contact 300 by the third active fin F3. The sixth contact 310 may be connected to a fifth gate electrode G5. The fifth gate electrode G5 may extend in the second direction X to intersect the fourth through ninth active fins F4 through F9.

The second pull-up transistor PU2 may be formed at the intersection of the fourth active fin F4 with the fifth gate electrode G5. The second pull-down transistor PD2 may be formed at each of the intersections of the fifth and sixth active fins F5 and F6 with the fifth gate electrode G5. The drive transistor DT may be formed at each of the intersections of the seventh through ninth active fins F7 through F9 with the fifth gate electrode G5.

Because the first contact 300 is connected to the fifth gate electrode G5 by the third active fin F3 and the sixth contact 310, outputs of the first pull-up transistor PU1, the first pull-down transistor PD1, and the first select transistor PS1 may be transmitted to gates of the second pull-up transistor PU2, the second pull-down transistor PD2, and the drive transistor DT.

A drain of the second pull-up transistor PU2 and a drain of the second pull-down transistor PD2 may be connected to a seventh contact 312 and a fourteenth contact 326. The seventh contact 312 may be connected to the first gate electrode G1. Therefore, an output of the second pull-up transistor PU2 and an output of the second pull-down transistor PD2 may be transmitted to gates of the first pull-up transistor PU1 and the first pull-down transistor PD1.

A source of the second pull-up transistor PU2 may be connected to an eighth contact 314. The eighth contact 314 may be connected to the power source node VDD. A source of the second pull-down transistor PD2 and a source of the drive transistor DT may be connected to a thirteenth contact 324. The thirteenth contact 324 may be connected to the ground node VSS.

The second select transistor PS2 may be formed at each of the intersections of the fifth and sixth active fins F5 and F6 with a third gate electrode G3. The pass transistor PT may be formed at each of the intersections of the seventh through ninth active fins F7 through F9 with a fourth gate electrode G4.

A source of the second select transistor PS2 may be connected to a ninth contact 316. The ninth contact 316 may be connected to the complementary bit line BLb. A drain of the second select transistor PS2 may be connected to the fourteenth contact 326. Because the fourteenth contact 326 is connected to the seventh contact 312 by the fourth active fin F4, an output of the second select transistor PS2 may be transmitted to the gates of the first pull-up transistor PU1 and the first pull-down transistor PD1. The third gate electrode G3 may be connected to a tenth contact 318. The tenth contact 318 may be connected to the write word line WWL. In other words, the tenth contact 318 and the fourth contact 306 may be electrically connected to each other.

A source of the pass transistor PT may be connected to an eleventh contact 320. The eleventh contact 320 may be connected to the read bit line RBL. A drain of the pass transistor PT may be connected to a drain of the drive transistor DT.

The fourth gate electrode G4 may be connected to the twelfth contact 322. The twelfth contact 322 may be connected to the read word line RWL. In some embodiments, the first SRAM cell region SMC1 and the second SRAM cell region SMC2 may share the twelfth contact 322 and the thirteenth contact 324. However, the present disclosure is not limited thereto, and any modifications can be made. For example, in some embodiments of present inventive concepts, the first SRAM cell region SMC1 and the second SRAM cell region SMC2 may not share a contact and may respectively be connected to the write word line RWL and the ground node VSS by separate contacts.

The drive transistor DT and the pass transistor PT may be formed using three active fins F7 through F9. The second pull-down transistor PD2 and the second select transistor PS2 may be formed using two active fins F5 and F6. The second pull-up transistor PU2 may be formed using one active fin F4. Therefore, the drive transistor DT and the pass transistor PT may be larger than the second pull-down transistor PD2 and the second select transistor PS2, and the second pull-down transistor PD2 and the second select transistor PS2 may be larger than the second pull-up transistor PU2. In other words, in some embodiments, transistors disposed at a boundary between the first SRAM cell region SMC1 and the second SRAM cell region SMC2 may be larger than transistors far away from the boundary between the first SRAM cell region SMC1 and the second SRAM cell region SMC2.

The transistors PU1 and PU2, PD1 and PD2, PS1 and PS2, PT and DT included in the semiconductor device 6 may employ the structures of FIGS. 1-5.

Figure 18:
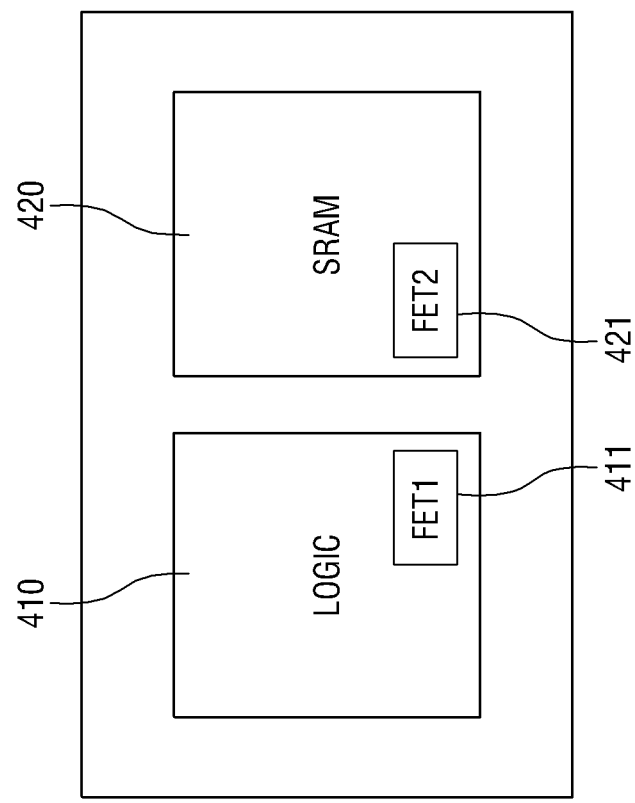
FIG. 18 is a diagram of a semiconductor device according to various embodiments of present inventive concepts.
Figure 19:
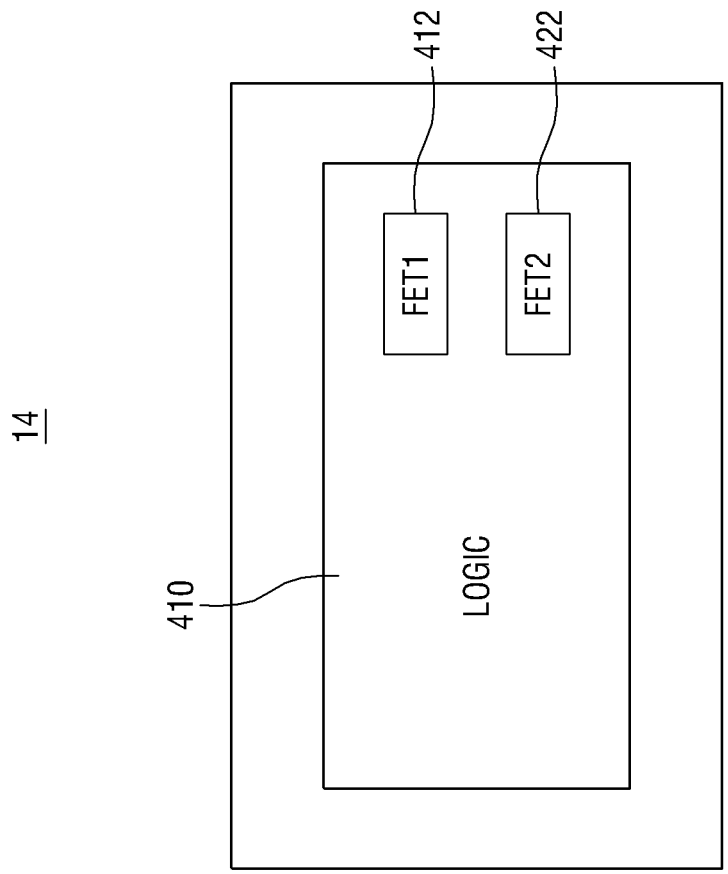
FIG. 19 is a diagram of a semiconductor device according to various embodiments of present inventive concepts.

FIG. 18 is a diagram of a semiconductor device 13 according to various embodiments of present inventive concepts. FIG. 19 is a diagram of a semiconductor device 14 according to various embodiments of present inventive concepts. For simplicity, a redundant description of elements identical to those of FIGS. 1-17 may be omitted, and various embodiments will hereinafter be described, focusing mainly on differences with respect to FIGS. 1-17.

Referring to FIG. 18, the semiconductor device 13 may include a logic region 410 and an SRAM region 420. An eleventh transistor 411 may be disposed in the logic region 410, and a twelfth transistor 421 may be disposed in the SRAM region 420.

In some embodiments of present inventive concepts, a threshold voltage of the eleventh transistor 411 may be higher than that of the twelfth transistor 421. Accordingly, if the first transistor TR1 of FIG. 1 is employed as the eleventh transistor 411, any one of the second through fourth transistors TR2 through TR4 of FIG. 1 may be employed as the twelfth transistor 421.

Referring to FIG. 19, the semiconductor device 14 may include a logic region 410. In the logic region 410, thirteenth and fourteenth transistors 412 and 422 that are different from each other may be disposed. In some embodiments, the thirteenth and fourteenth transistors 412 and 422 that are different from each other may also be disposed in an SRAM region.

In some embodiments of present inventive concepts, a threshold voltage of the thirteenth transistor 412 may be higher than that of the fourteenth transistor 422. Accordingly, if the first transistor TR1 of FIG. 5 is employed as the thirteenth transistor 412, then any one of the second through fourth transistors TR2 through TR4 of FIG. 5 may be employed as the fourteenth transistor 422.

In FIGS. 18 and 19, the logic region 410 and the SRAM region 420 are illustrated as an example, but the present disclosure is not limited to this example. The present disclosure is also applicable to the logic region 410 and a region where a different memory (e.g., Dynamic Random Access Memory (DRAM), Magnetoresistive Random Access Memory (MRAM), Resistive Random Access Memory (RRAM), Phase-Change Random Access Memory (PRAM), etc.) is formed.

Figure 20:
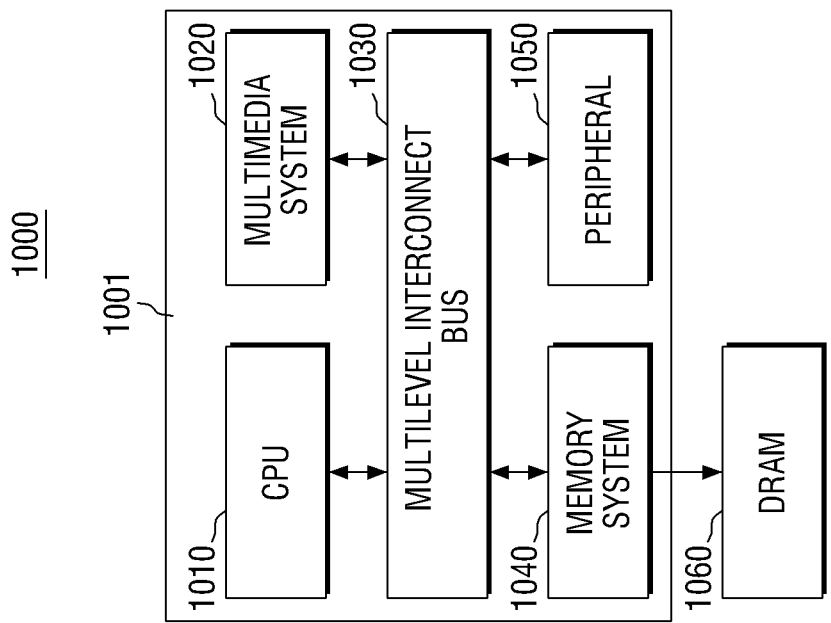
FIG. 20 is a block diagram of a system-on-chip (SoC) system including semiconductor devices according to various embodiments of present inventive concepts.

FIG. 20 is a block diagram of a system-on-chip (SoC) system 1000 including semiconductor devices according to various embodiments of present inventive concepts. Referring to FIG. 20, the SoC system 1000 includes an application processor 1001 and a dynamic random access memory (DRAM) 1060.

The application processor 1001 may include a central processing unit (CPU) 1010, a multimedia system 1020, a bus 1030, a memory system 1040, and a peripheral circuit 1050.

The CPU 1010 may perform operations needed to drive the SoC system 1000. In some embodiments of present inventive concepts, the CPU 1010 may be configured as a multi-core environment including a plurality of cores.

The multimedia system 1020 may be used to perform various multimedia functions in the SoC system 1000. The multimedia system 1020 may include a 3D engine module, a video codec, a display system, a camera system, a post-processor, etc.

The bus 1030 may be used for data communication among the CPU 1010, the multimedia system 1020, the memory system 1040 and the peripheral circuit 1050. In some embodiments of present inventive concepts, the bus 1030 may have a multilayer structure. Specifically, the bus 1030 may be, but is not limited to, a multilayer advanced high-performance bus (AHB) or a multilayer advanced extensible interface (AXI).

The memory system 1040 may provide an environment needed for the application processor 1001 to be connected to an external memory (e.g., the DRAM 1060) and may operate at high speed. In some embodiments, the memory system 1040 may include a controller (e.g., a DRAM controller) for controlling the external memory (e.g., the DRAM 1060).

The peripheral circuit 1050 may provide an environment needed for the SoC system 1000 to smoothly connect to an external device (e.g., a mainboard). Accordingly, the peripheral circuit 1050 may include various interfaces that enable the external device connected to the SoC system 1000 to be compatible with the SoC system 1000.

The DRAM 1060 may function as an operating memory needed for the operation of the application processor 1001. In some embodiments, the DRAM 1060 may be placed outside the application processor 1001, as illustrated in FIG. 20. Specifically, the DRAM 1060 may be packaged with the application processor 1001 in the form of a package-on-package (PoP).

At least one of the elements of the SoC system 1000 may employ any one of the semiconductor devices 1-6, 13, and 14 according to above-described embodiments of present inventive concepts.

Figure 21:
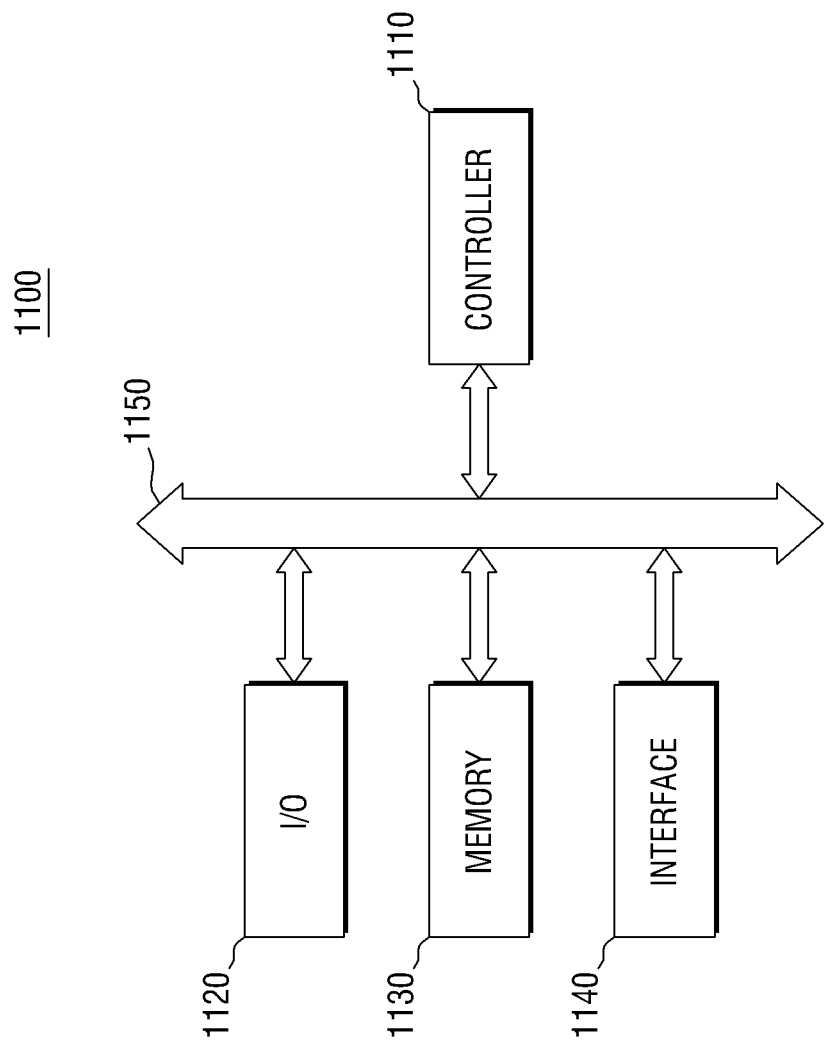
FIG. 21 is a block diagram of an electronic system including semiconductor devices according to various embodiments of present inventive concepts.

FIG. 21 is a block diagram of an electronic system 1100 including semiconductor devices according to various embodiments of present inventive concepts. Referring to FIG. 21, the electronic system 1100 may include a controller 1110, an input/output (I/O) device 1120, a memory device 1130, an interface 1140, and a bus 1150. The controller 1110, the I/O device 1120, the memory device 1130, and/or the interface 1140 may be connected to one another by the bus 1150. The bus 1150 may serve as a path for transmitting data.

The controller 1110 may include at least one of a microprocessor, a digital signal processor, a microcontroller, and logic devices capable of performing similar functions to those of a microprocessor, a digital signal processor, and a microcontroller. The I/O device 1120 may include a keypad, a keyboard, and a display device. The memory device 1130 may store data and/or commands. The interface 1140 may be used to transmit data to or receive data from a communication network. The interface 1140 may be a wired or wireless interface. In an example, the interface 1140 may include an antenna or a wired or wireless transceiver.

In some embodiments, the electronic system 1100 may be an operating memory for improving the operation of the controller 1110, and may also include a high-speed DRAM or SRAM. Here, any one of the semiconductor devices 1-6, 13, and 14 according to above-described embodiments of present inventive concepts may be employed as the operating memory. In addition, any one of the semiconductor devices 1-6, 13, and 14 according to the above-described embodiments may be provided in the memory device 1130 or in the controller 1110 or the I/O device 1120.

The electronic system 1100 may be applied to nearly all types of electronic products capable of transmitting or receiving information in a wireless environment, such as a personal data assistant (PDA), a portable computer, a web tablet, a wireless phone, a mobile phone, a digital music player, a memory card, etc.

Figure 22:
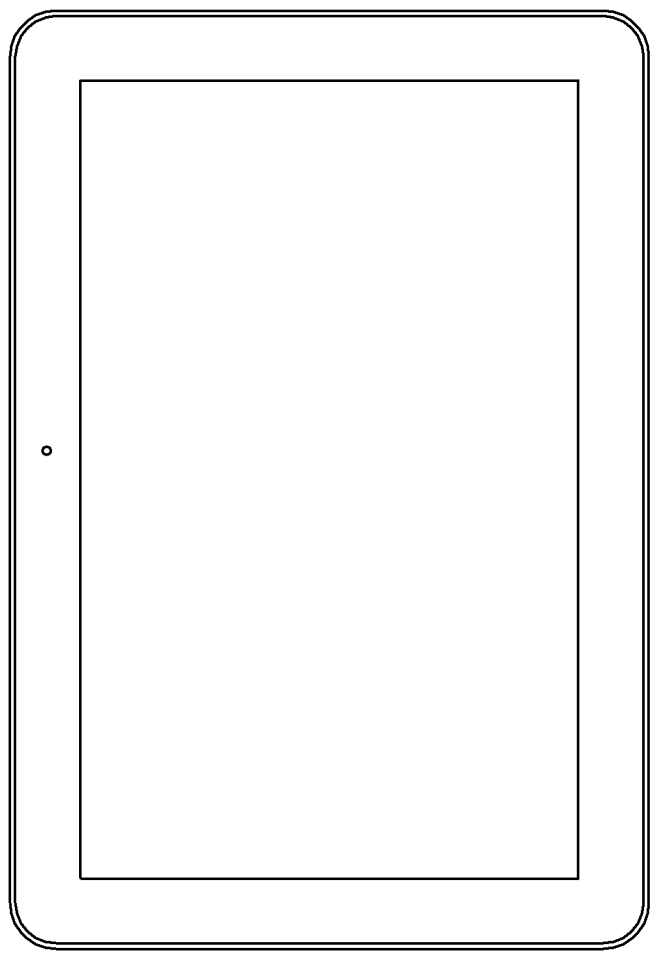
FIGS. 22 through 24 are diagrams illustrating examples of a semiconductor system to which semiconductor devices according to various embodiments of present inventive concepts can be applied.
Figure 23:
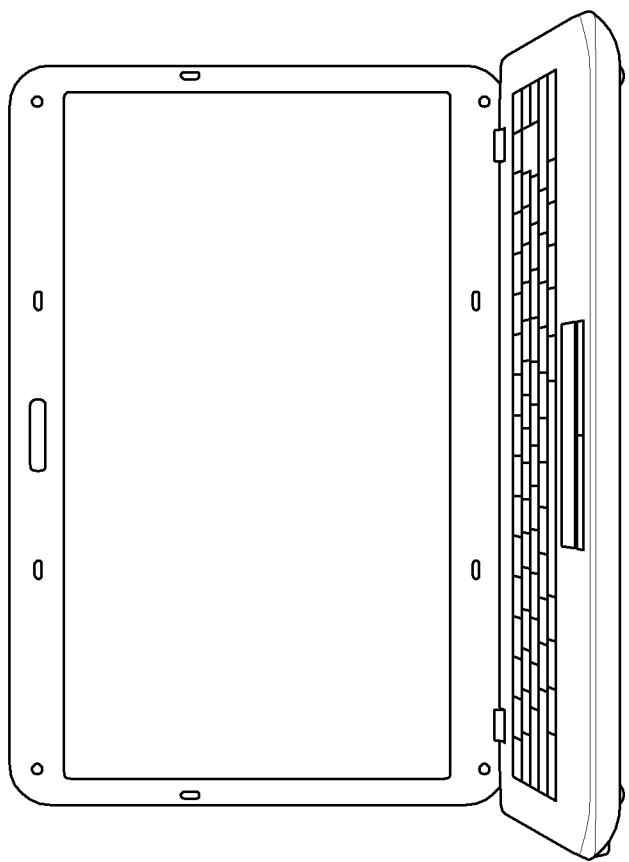
Figure 24:
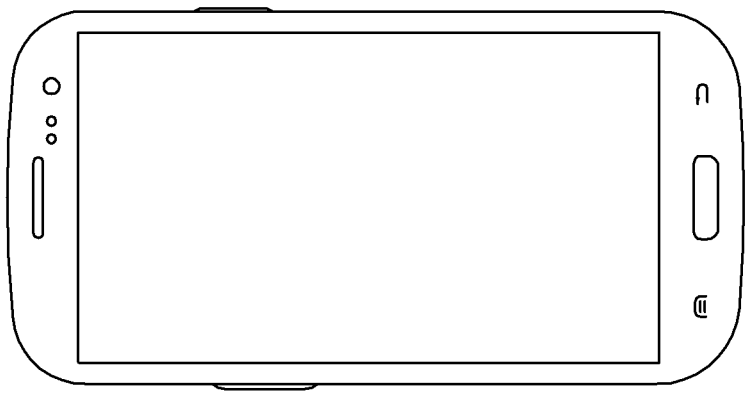

FIGS. 22 through 24 are diagrams illustrating examples of a semiconductor system to which semiconductor devices according to various embodiments of present inventive concepts can be applied.

FIG. 22 illustrates a tablet computer (e.g., a tablet personal computer (PC) or any other type of tablet computer) 1200, FIG. 23 illustrates a notebook or laptop computer 1300, and FIG. 24 illustrates a smartphone 1400. At least one of the semiconductor devices 1-6, 13, and 14 according to above-described embodiments of present inventive concepts, as set forth herein, may be used in the tablet computer 1200, the notebook or laptop computer 1300, and the smartphone 1400.

The semiconductor devices 1-6, 13, and 14 according to various embodiments of present inventive concepts, as set forth herein, may also be applied to various Integrated Circuit (IC) devices in addition to those set forth herein. In other words, although the tablet computer 1200, the notebook or laptop computer 1300, and the smartphone 1400 have been described above as examples of a semiconductor system according to some embodiments of present inventive concepts, examples of the semiconductor system are not limited to the tablet computer 1200, the notebook or laptop computer 1300, and the smartphone 1400. In some embodiments of present inventive concepts, the semiconductor system may be provided as a computer, an Ultra Mobile PC (UMPC), a work station, a net-book computer, a PDA, a portable computer, a wireless phone, a mobile phone, an e-book, a portable multimedia player (PMP), a portable game console, a navigation device, a digital camera, a 3-dimensional television set, a digital audio recorder, a digital audio player, a digital picture recorder, a digital picture player, a digital video recorder, a digital video player, etc.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A method of fabricating a semiconductor device, the method comprising:
    forming a gate insulating layer on first through fourth areas of a substrate;
    providing a first concentration of nitrogen to portions of the gate insulating layer that are formed on the first and second areas of the substrate, and a second concentration of nitrogen to portions of the gate insulating layer that are formed on the third and fourth areas of the substrate, wherein the second concentration of nitrogen comprises a different concentration from the first concentration of nitrogen;
    forming a work function control material layer on the first through fourth areas of the substrate;
    forming a capping layer on the work function control material layer, wherein the capping layer is formed to a first thickness on the first and third areas of the substrate, and to a second thickness that is different from the first thickness, on the second and fourth areas of the substrate; and
    annealing the substrate.

2. The method of claim 1, wherein providing the first and second concentrations of nitrogen to the gate insulating layer comprises:
    forming a mask on the third and fourth areas of the substrate; then
    nitriding the portions of the gate insulating layer formed on the first through fourth areas of the substrate.

3. The method of claim 1,
    wherein forming the capping layer comprises forming first and second capping layers that are stacked sequentially,
    wherein the first capping layer comprises the different first and second thicknesses, and
    wherein the second capping layer is formed to a third thickness on the first and third areas of the substrate that is equally thick as a fourth thickness of the second capping layer on the second and fourth areas of the substrate.

4. The method of claim 3, wherein the first and second capping layers comprise a nitride layer and a semiconductor material, respectively.

5. The method of claim 4, wherein the first and second capping layers comprise titanium nitride (TiN) and silicon (Si), respectively.

6. The method of claim 1,
    wherein forming the capping layer comprises forming first and second capping layers that are stacked sequentially,
    wherein a third thickness of portions of the first capping layer formed on the first and third areas of the substrate is equally thick as a fourth thickness of portions of the first capping layer formed on the second and fourth areas of the substrate, and
    wherein the method further comprises removing the second capping layer from the first and third areas of the substrate but not the second and fourth areas of the substrate.

7. The method of claim 1,
    wherein the work function control material layer comprises a work function control material, and
    wherein the work function control material comprises any one of lanthanum and aluminum.

8. The method of claim 7,
    wherein forming the gate insulating layer comprises forming first through fourth gate insulating layers on the first through fourth areas of the substrate, respectively,
    wherein after annealing the substrate, a first amount of the work function control material in each of the first and second gate insulating layers is different from a second amount of the work function control material in each of the third and fourth gate insulating layers, and
    wherein third and fourth thicknesses of the first and third gate insulating layers, respectively, are different from fifth and sixth thicknesses of the second and fourth gate insulating layers, respectively.

9. The method of claim 1, wherein forming the gate insulating layer on the first through fourth areas comprises:
    forming an interlayer insulating film comprising first through fourth trenches formed on the first through fourth areas, respectively; and
    forming the gate insulating layer in the first through fourth trenches.

10. A method of fabricating a semiconductor device, the method comprising:
    forming a gate insulating layer on first through fourth areas of a substrate;
    providing a first concentration of nitrogen to portions of the gate insulating layer that are formed on the first and second areas of the substrate, and a second concentration of nitrogen to portions of the gate insulating layer that are formed on the third and fourth areas of the substrate, wherein the second concentration of nitrogen comprises a different concentration from the first concentration of nitrogen;
    forming a blocking layer on the gate insulating layer;
    removing the blocking layer from the second and fourth areas of the substrate, but not the first and third areas of the substrate;
    forming a work function control material layer on the first through fourth areas of the substrate;

forming a capping layer on the work function control material layer; and annealing the substrate.

11. The method of claim 10, wherein the blocking layer comprises a nitride layer.

* * * * *